(12) United States Patent
Ozasa

(10) Patent No.: US 7,863,946 B2
(45) Date of Patent: Jan. 4, 2011

(54) ELECTRIC SIGNAL OUTPUTTING APPARATUS WITH A SWITCHING PART, AN IMPEDANCE MATCHING PART, AND AN AUXILIARY SWITCHING PART

(75) Inventor: Dan Ozasa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 785 days.

(21) Appl. No.: 11/564,608

(22) Filed: Nov. 29, 2006

(65) Prior Publication Data

US 2007/0126517 A1 Jun. 7, 2007

(30) Foreign Application Priority Data

Dec. 1, 2005 (JP) ............... 2005-347969
Dec. 5, 2005 (JP) ............... 2005-350660

(51) Int. Cl.
*H03B 15/00* (2006.01)
(52) U.S. Cl. .................. 327/108; 327/112; 327/26; 327/27; 327/30; 307/98
(58) Field of Classification Search .................. 326/30
See application file for complete search history.

(56) References Cited

U.S. PATENT DOCUMENTS

| 6,175,463 | B1 * | 1/2001 | Nayebi et al. ............ 360/68 |
| 6,675,272 | B2 * | 1/2004 | Ware et al. ............... 711/167 |
| 6,683,482 | B2 * | 1/2004 | Humphrey et al. ........ 327/170 |
| 7,236,018 | B1 * | 6/2007 | Wang et al. .............. 327/108 |
| 7,425,849 | B2 * | 9/2008 | Gupta et al. ............. 327/112 |
| 7,528,625 | B2 * | 5/2009 | Ozasa et al. ............. 326/30 |
| 7,728,641 | B2 * | 6/2010 | Lee ......................... 327/170 |
| 2002/0118042 | A1 * | 8/2002 | Helt et al. .................. 326/86 |
| 2005/0127956 | A1 * | 6/2005 | Rho ......................... 327/112 |

FOREIGN PATENT DOCUMENTS

| JP | 2002-324937 | 11/2002 |
| JP | 2002-325019 | 11/2002 |

\* cited by examiner

*Primary Examiner*—Jared J Fureman
*Assistant Examiner*—Justen Fauth
(74) *Attorney, Agent, or Firm*—Oblon, Spivak, McClelland, Maier & Neustadt, L.L.P.

(57) ABSTRACT

The present invention discloses an electric signal outputting apparatus in a serial electric transmission system. The electric signal outputting apparatus includes a switching part for switchably generating high and low output signals in accordance with signal data and transmitting the output signals to a transmission path, an impedance matching part for matching an output impedance to the impedance of the transmission path, and an auxiliary switching part for subsidiarily supplying current to an output node in the transmission path and subsidiarily absorbing current from the output node in the transmission path when the switching part switches the generation between high and low output signals, wherein the auxiliary switching part conducts the supplying and the absorbing for a period shorter than a pulse width of a reference clock of the serial electric transmission system.

9 Claims, 40 Drawing Sheets

DELAY CONTROL INVERTER

DELAY CONTROL
INVERTER

ELECTRIC SIGNAL OUTPUTTING APPARATUS WITH A SWITCHING PART, AN IMPEDANCE MATCHING PART, AND AN AUXILIARY SWITCHING PART

BACKGROUND OF THE INVENTION

1. Field of the Invention

The present invention relates to an electric signal outputting apparatus, a semiconductor laser modulation driving apparatus, and an image forming apparatus.

2. Description of the Related Art

In recent years and continuing, the band of signals output (output signal band) from an electric signal outputting apparatus (e.g. output driver of an integrated circuit) has drastically increased to a high speed along with, for example, the forming of fine-sized integrated circuits and the use of serial signal transmission methods. As the speed of the output signal bands increases, the electric signal outputting apparatus (e.g. output driver) is expected to fulfill more requirements.

For example, since it becomes difficult to accurately transfer data when the rise or drop of a signal wave is slow or when the jitter of a reference clock is large, it is desired for the electric signal outputting apparatus (e.g. output driver) to increase the speed of the rise or the drop of the output signal as much as possible and to generate an output signal having a waveform as close as possible to the shape of a square wave. However, in a case where the output impedance of the output side does not match the impedance of the transmission line (more specifically, in a case where the input impedance of the receiver side does not match the characteristic impedance of the transmission line), the waveform of the output signals may become distorted by reflection caused when increasing the speed of the frequency components included in the output signals. Such distortion in the waveform of the signals may adversely affect data transmission. Therefore, the output impedance of the output side and the impedance of the transmission line are to match each other in order to increase the speed of the signal output.

However, even in a case where a match in the impedances is obtained, the increase in the speed of the output signal band may cause energy loss due to, for example, dielectric loss. Taking the energy loss into consideration, there is a method referred to as "emphasis" where the output voltage amplitude of data is emphasized beforehand when the output is switched. For example, Japanese Laid-Open Patent Application No. 2002-325019 discloses a configuration of an emphasis circuit.

However, as the speed of signal transmission further increases, a large amount of time is consumed in charging and discharging the capacitance of the transistor or diodes for electrostatic protection or the parasitic capacitance of output nodes. As a result, it is becoming more difficult to increase the speed of the rise and drop of output signals. Furthermore, the above-described emphasis method disclosed in Japanese Laid-Open Patent Application No. 2002-325019 is used for the purpose of compensating for high frequency loss, and not for increasing the speed of the rise and/or drop of signals. Therefore, the emphasis method disclosed in Japanese Laid-Open Patent Application No. 2002-325019 is limited to increasing the speed of the rise and/or drop of signals only to a certain extent.

SUMMARY OF THE INVENTION

The present invention may provide an electric signal outputting apparatus, a semiconductor laser modulation driving apparatus, and an image forming apparatus that substantially obviate one or more of the problems caused by the limitations and disadvantages of the related art.

Features and advantages of the present invention are set forth in the description which follows, and in part will become apparent from the description and the accompanying drawings, or may be learned by practice of the invention according to the teachings provided in the description. Objects as well as other features and advantages of the present invention will be realized and attained by an electric signal outputting apparatus, a semiconductor laser modulation driving apparatus, and an image forming image forming apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides an electric signal outputting apparatus in a serial electric transmission system, the electric signal outputting apparatus including: a switching part for switchably generating high and low output signals in accordance with signal data and transmitting the output signals to a transmission path (output node); an impedance matching part for matching an output impedance to the impedance of the transmission path; and an auxiliary switching part for subsidiarily supplying current to an output node in the transmission path and subsidiarily absorbing current from the output node in the transmission path when the switching part switches the generation between high and low output signals; wherein the auxiliary switching part conducts the supplying and the absorbing for a period shorter than a pulse width of a reference clock of the serial electric transmission system.

In the electric signal outputting apparatus according to an embodiment of the present invention, the auxiliary switching part may include a current switching part that supplies current to the output node and absorbs current from the output node, and an auxiliary switching data generating part that generates auxiliary switching data used for supplying current to the output node and data used for absorbing current from the output node.

In the electric signal outputting apparatus according to an embodiment of the present invention, the auxiliary switching data generating part may include a delay control voltage generating part that generates delay control voltage and a delay data generating part that generates delay data in accordance with the delay control voltage generated by the delay control voltage generating part.

In the electric signal outputting apparatus according to an embodiment of the present invention, the delay data generating part may include a delay locked loop (DLL).

In the electric signal outputting apparatus according to an embodiment of the present invention, the current switching part may include a P-type current source that supplies current from a supply voltage to the output node, an N-type current source that absorbs current from the output node and outputs the absorbed current to GND, an auxiliary switching pch transistor provided between the P-type current source and the output node, and an auxiliary switching nch transistor provided between the N-type current source and the output node.

In the electric signal outputting apparatus according to an embodiment of the present invention, the auxiliary switching data generating part may switch either one of the auxiliary switching pch transistor or the auxiliary switching nch transistor in synchronization with the switching part and switches the other one of the auxiliary switching pch transistor or the auxiliary switching nch transistor at a timing delayed a predetermined length shorter than the pulse width of the reference clock.

In the electric signal outputting apparatus according to an embodiment of the present invention, the impedance matching part includes a plurality of transistors, wherein the impedance matching part is configured to adjust the output impedance by selecting at least one of the plural transistors to be switched on.

In the electric signal outputting apparatus according to an embodiment of the present invention, the switching part may use a differential signal transmission method for generating a normal type output signal and an inverted type output signal and outputting the two types of output signals.

Furthermore, an embodiment of the present invention provides a semiconductor laser modulation driving apparatus including a semiconductor laser driving part and a semiconductor laser modulation part that are formed on separate chips, the semiconductor laser modulation driving apparatus including: the electric signal outputting apparatus for conducting signal transmission between the semiconductor laser driving part and the semiconductor laser modulating part.

Furthermore, an embodiment of the present invention provides an image forming apparatus conducting electric signal transmission between chips or boards, the image forming apparatus conducting the electric signal transmission by using the electric signal outputting apparatus or the semiconductor laser modulation driving apparatus according to an embodiment of the present invention.

Furthermore, an embodiment of the present invention provides an electric signal outputting apparatus in a serial electric transmission system, the electric signal outputting apparatus including: a switching part for switchably generating high and low output signals in accordance with signal data and transmitting the output signals to a transmission path; an impedance matching part for matching an output impedance to the impedance of the transmission path, the impedance matching part including a reference voltage generating part and a terminal part controlled in accordance with a voltage generated by the reference voltage generating part; and an auxiliary switching part for subsidiarily supplying current to an output node in the transmission path and subsidiarily absorbing current from the output node in the transmission path when the switching part switches the generation between high and low output signals; wherein the auxiliary switching part conducts the supplying and the absorbing for a period shorter than a pulse width of a reference clock of the serial electric transmission system.

In the electric signal outputting apparatus according to an embodiment of the present invention, the terminal part may include a resistor and an impedance matching transistor, wherein the reference voltage generating part includes an operational amplifier, wherein the operational amplifier generates a reference voltage for controlling a gate voltage of the impedance matching transistor.

In the electric signal outputting apparatus according to an embodiment of the present invention, the reference voltage generating part may include a dummy circuit part having the same circuit configuration as the terminal part.

In the electric signal outputting apparatus according to an embodiment of the present invention, the dummy circuit part may include a dummy resistor having a resistance value different from the resistance value of the resistor of the terminal part and a dummy impedance matching transistor having a size different from the size of the impedance matching transistor.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

First Example

Figure 1:
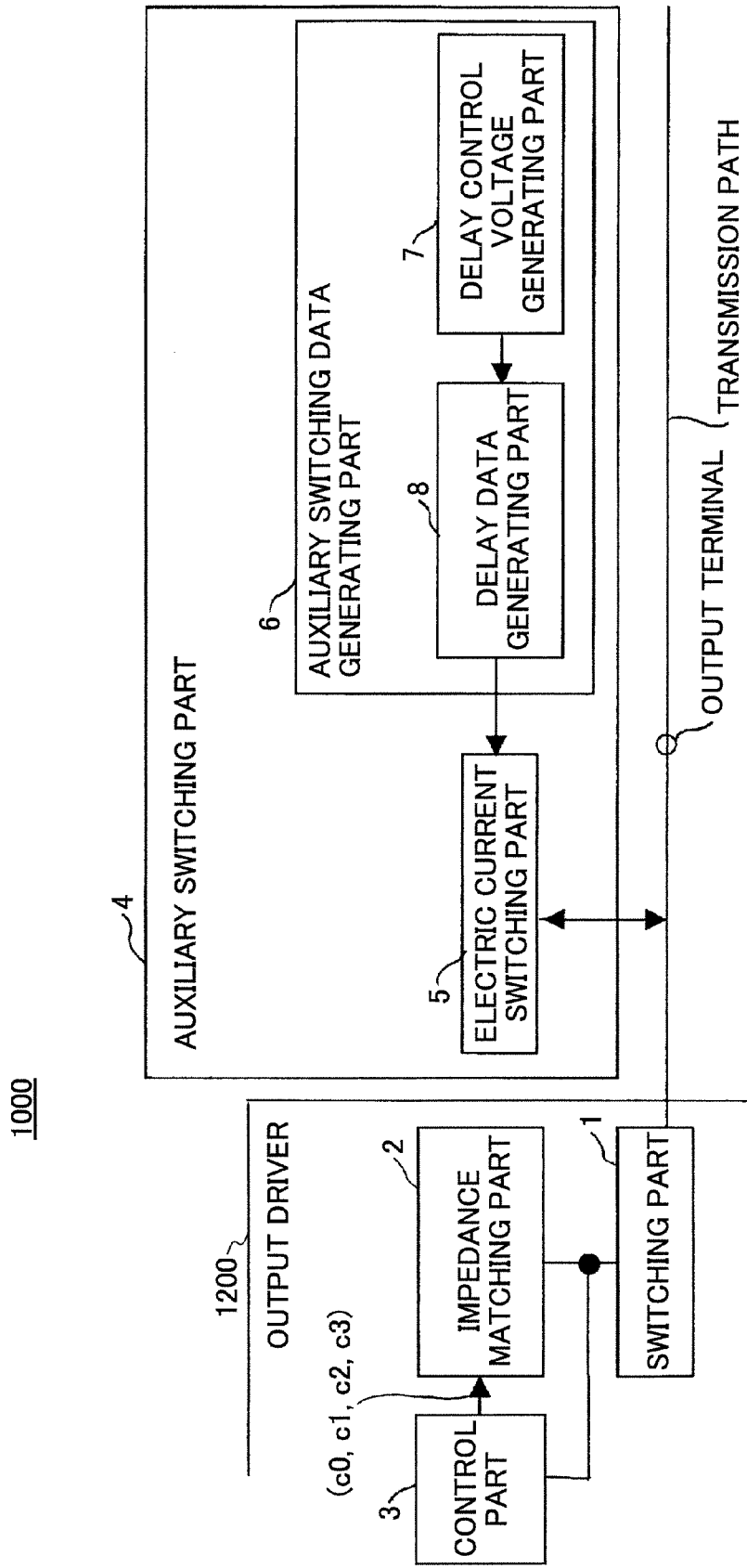
FIG. 1 is a schematic diagram showing an exemplary configuration of an electric signal outputting apparatus according to an embodiment of the present invention.

FIG. 1 shows an exemplary configuration of an electric signal outputting apparatus 1200 in a serial electric transmission system 1000 according to an embodiment of the present invention. The electric signal outputting apparatus 1200 according to this embodiment of the present invention is used for a serial electric transmission system 1000 and includes a switching part 1 for switchably generating high and low output signals in accordance with signal data and transmitting the output signals to a transmission path (output node) connected to, for example, the serial electric transmission system 1000, an impedance matching part 2 for matching the impedance of the electric signal outputting apparatus (output impedance) 1200 to the impedance of the transmission path, a control part (controller) for setting the impedance matching part 2 for enabling the impedance matching part 2 to match the output impedance of the electric signal outputting apparatus 1200 to the impedance of the transmission path, and an auxiliary switching part 4 for subsidiarily supplying current to an output node and subsidiarily absorbing current from the output node when the switching part 1 switches the generation between high and low output signals, wherein the auxiliary switching part conducts the supplying and absorbing for a period shorter than a pulse width of a reference clock of the serial electric transmission system 1000.

In this example, the impedance of the transmission path includes the impedance of the transmission path anticipated by the sender side and the impedance input to the receiver side (hereinafter simply referred to as "impedance of the transmission path").

Figure 2:
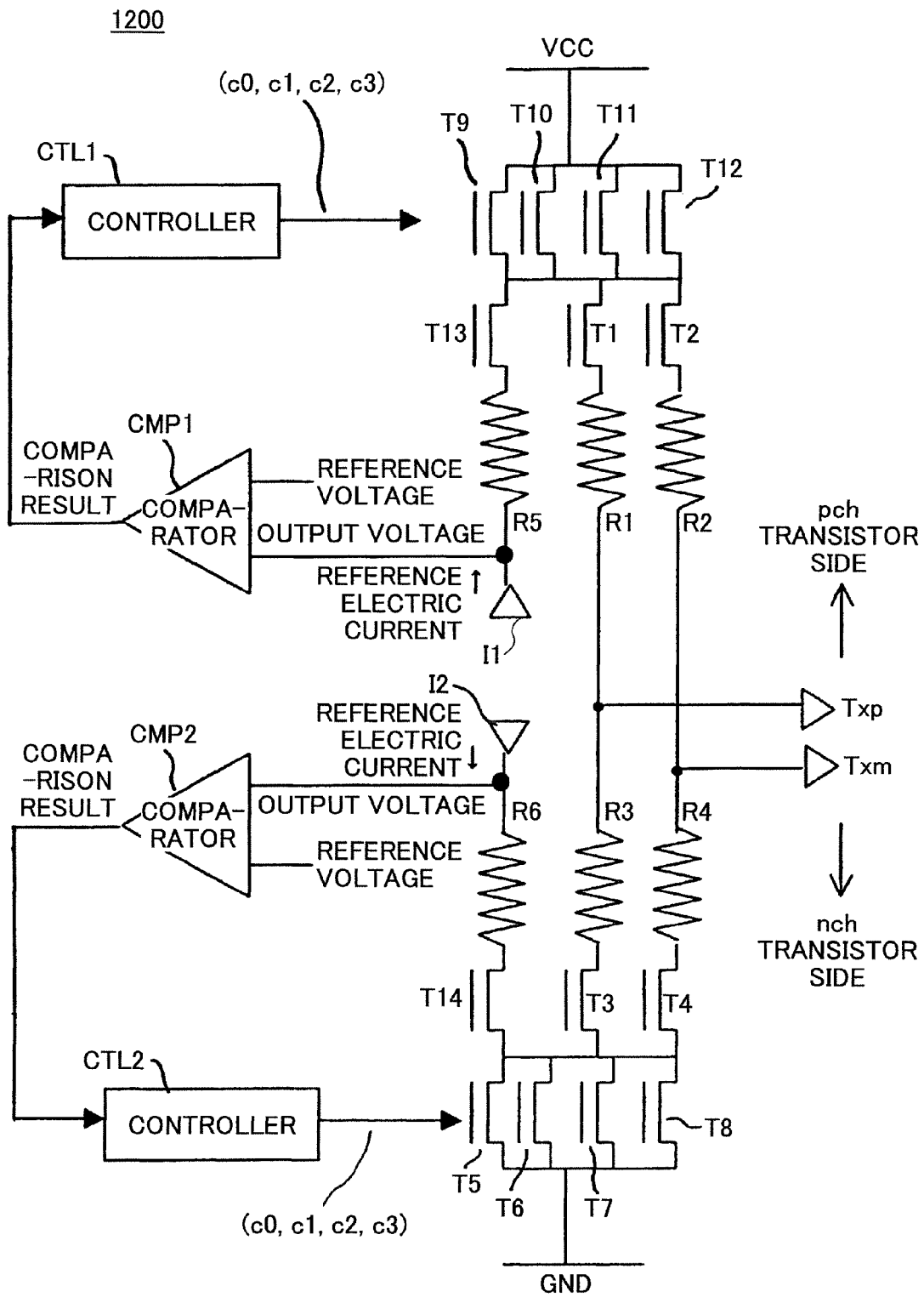
FIG. 2 is a schematic diagram showing a detailed exemplary configuration of the electric signal outputting apparatus of FIG. 1.

FIG. 2 shows a more detailed configuration of the electric signal outputting apparatus 1200 shown in FIG. 1. It is however to be noted that the switching part 1, the impedance matching part 2, and the control part (controller) 3 are illustrated in FIG. 2, but the auxiliary switching part 4 is not illustrated in FIG. 2.

That is, in FIG. 2, the switching part 1 includes: pch transistors (MOS transistors) T1, T2; resistors R1, R2 corresponding to the pch transistors T1, T2; nch transistors (MOS transistors) T3, T4; resistors R3, R4 corresponding to the nch transistors (MOS transistors); and output terminals Txp, Txm. The switching part 1 uses a differential signal transmission method in which the switching part 1 generates two output signals (one being a normal output signal and the other being an inverted output signal) and outputs the two signals.

The pch transistors T1, T2, and the nch transistors T3, T4 function as switch transistors. In a case where, for example, data 1 is input when only the pch transistor T1 and the nch transistor T4 are switched on, the pch transistor T1 and the nch transistor T4 form a circuit shown in FIG. 3, generate output signals corresponding to the normal output and the inverse output of the input data 1 shown in FIG. 5, and output the two output signals. In a case where, for example, data 0 is input when only the pch transistor T2 and the nch transistor T3 are switched on, the pch transistor T2 and the nch transistor T4 form a circuit shown in FIG. 4, generate output signals corresponding to the normal output and the inverse output of the input data 0 shown in FIG. 5, and output the two output signals.

Figure 3:
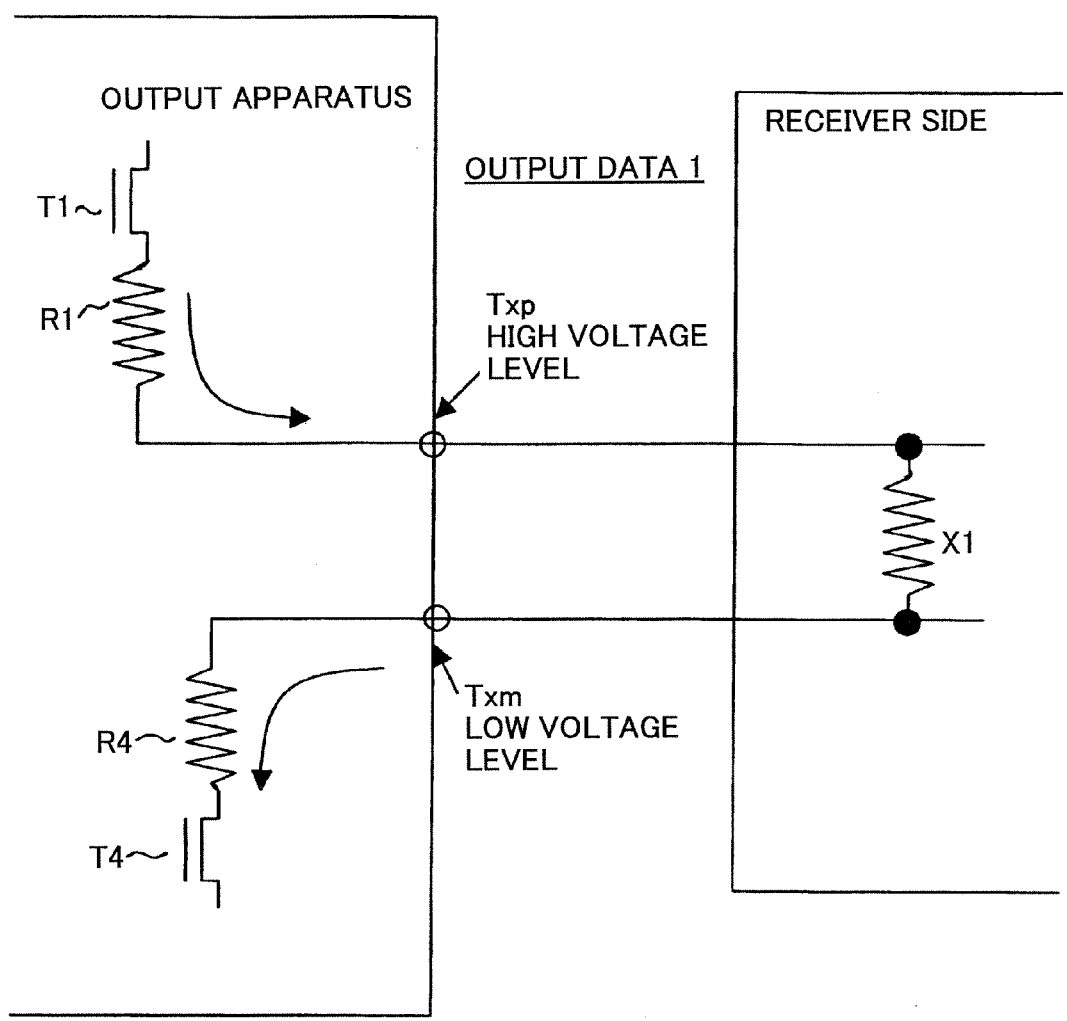
FIG. 3 is a schematic diagram for describing a switching part according to an embodiment of the present invention.
Figure 4:
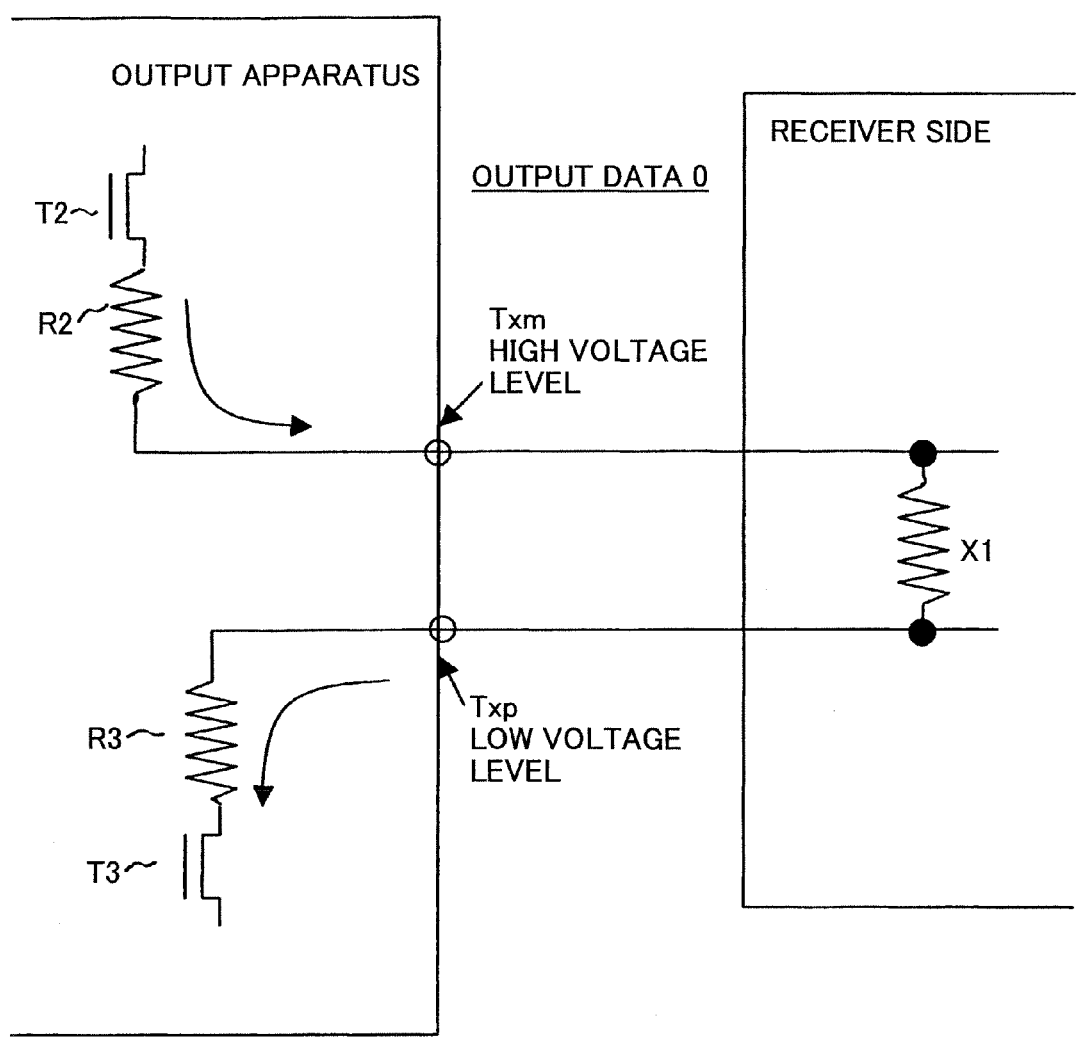
FIG. 4 is another schematic diagram for describing a switching part according to an embodiment of the present invention.
Figure 5:
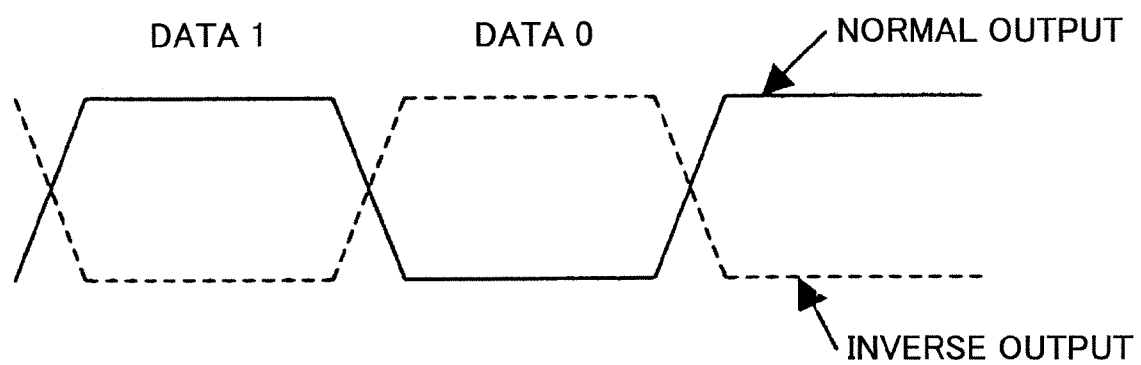
FIG. 5 is a yet another schematic diagram for describing a switching part according to an embodiment of the present invention.
Figure 6:
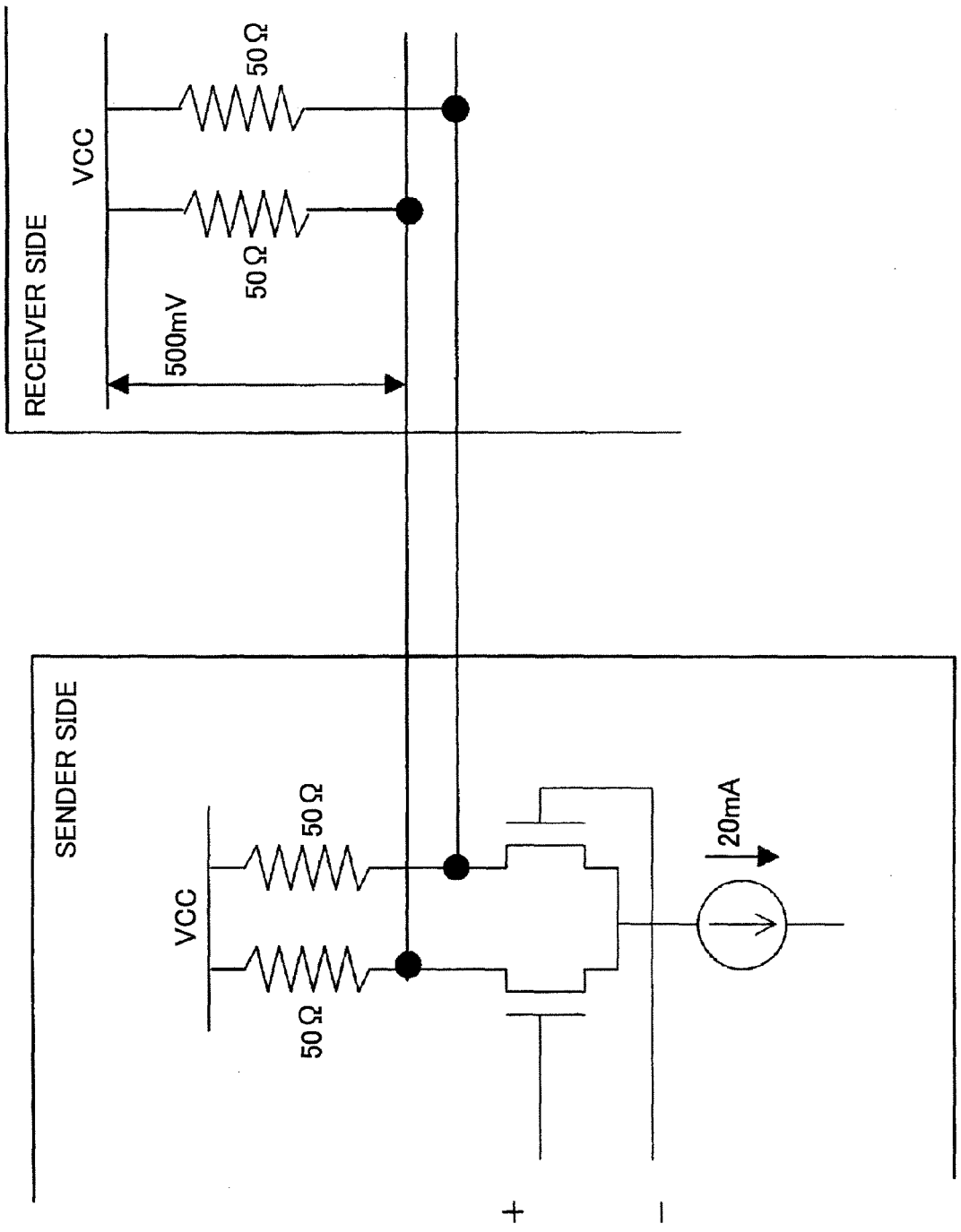
FIG. 6 is a schematic diagram for describing a regular CML circuit.

Since the switching part 1 includes a circuit configuration shown in FIGS. 3 and 4, the switching part 1, similar to a regular CML (Common Mode Logic, exemplified in FIG. 6), can output differential data of 1 and 0 in the form of small amplitude signals by switching on one switch transistor of the pch transistors T1, T2 and one switch transistor of the nch transistors T3, T4. The outputting of the small amplitude signals is suitable for achieving speed acceleration. Furthermore, the switching part 1 can reduce the amount of electric consumption compared to a regular CML circuit. For example, the CML circuit shown in FIG. 6 requires an electric current of 20 mA in a case of generating a signal voltage of 500 mV where the voltage of the power supply is 1 V (each resistor being 50Ω). Meanwhile, the circuits shown in FIGS. 3 and 4 require only an electric current of 5 mA in a case of generating a signal voltage of 500 mV where the voltage of the power supply is 1 V (resistor R1 (R2) being 50Ω, resistor R4 (R3) being 50Ω, and terminal resistor X1 toward the receiver side being 100Ω). Accordingly, the above-described configuration of the switching part 1 is suited for speed acceleration and is able to reduce the amount of power consumption by reducing the amount of necessary electric current.

Furthermore, since the switching part 1 shown in FIG. 2 is a differential signal transmission type that generates and outputs two output signals (one corresponding to normal output and the other corresponding to inverse output), the switching part 1 has greater durability with respect to noise of a common mode. Therefore, the configuration of the switching part 1 is effective against EMI.

In correspondence with the switching part 1 having the above-described configuration, the impedance matching part 2 shown in FIG. 2 has one impedance matching portion on the pch transistor side and another impedance matching portion on the nch transistor side. The impedance matching portion on the pch side includes plural pch transistors (MOS transistors) T9, T10, T11, and T12. The other impedance portion on the nch transistor side includes plural nch transistors (MOS transistors) T5, T6, T7, and T8.

Figure 7:
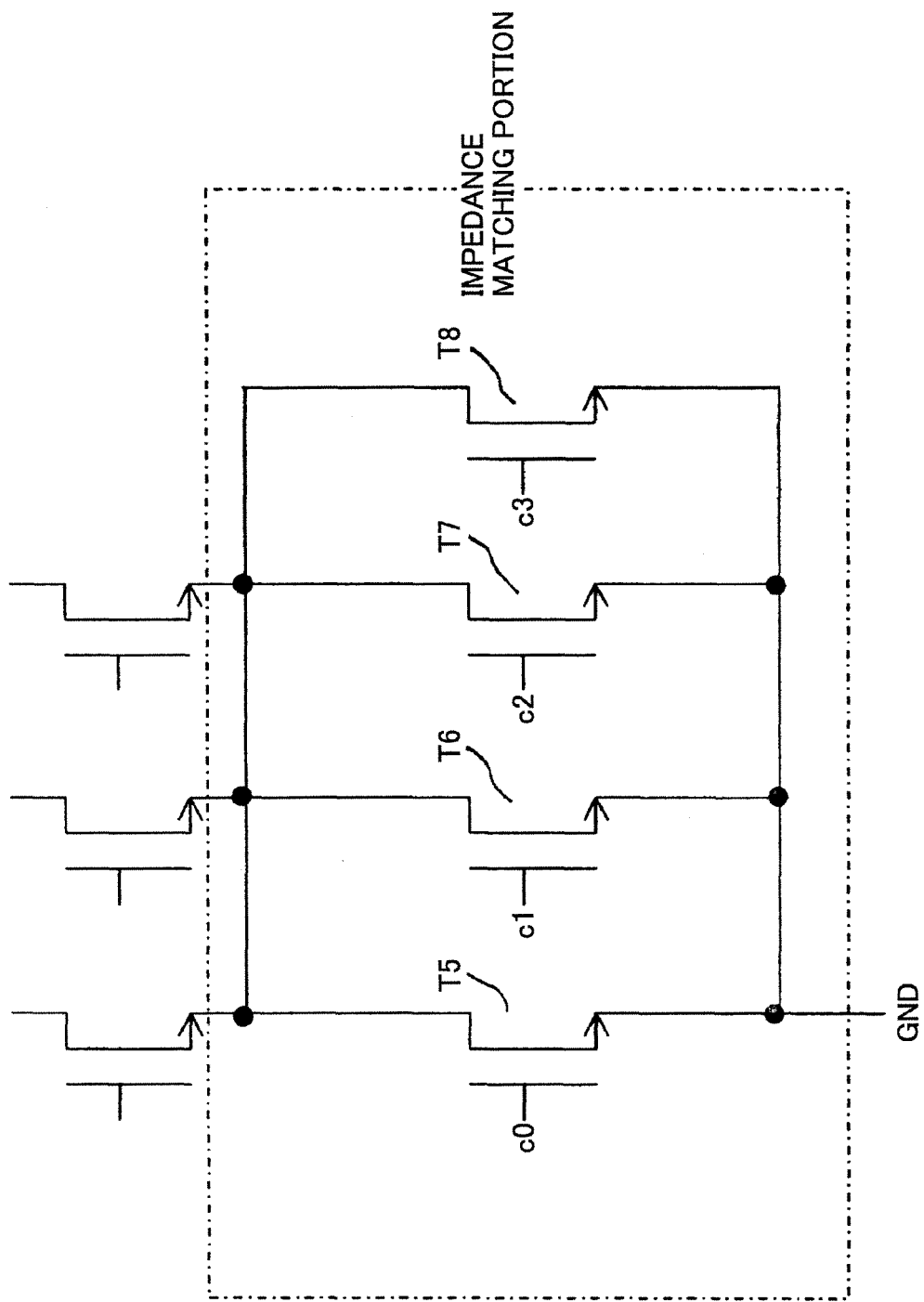
FIG. 7 is an enlarged view of an impedance matching part provided on the nch transistor side according to an embodiment of the present invention.

FIG. 7 is an enlarged view showing the impedance matching portion on the nch transistor side shown in FIG. 2. As shown in FIG. 7, plural transistors T5, T6, T7, T8 are connected in parallel. Each transistor T5, T6, T7, T8 is configured to be switched on when selected by a selection signal c0, c1, c2, c3 from the control part 3.

That is, the control part 3 uses the transistor parts in the impedance matching part 2 as resistance by selecting a transistor from the plural transistors connected in parallel in the impedance matching part 2. By switching on the selected transistor(s), a composite impedance of the plural transistors can be set to a desired impedance.

In a case where the impedance matching part 2 has the configuration shown in FIGS. 2 and 7, the transistor to be switched on can be selected by setting the selection signals c0, c1, c2, c3 to "high" or "low". By incrementing the selection signals c0, c1, c2, c3 in order, the composite impedance of the impedance matching part 2 can be changed in order. Although the transistors T5, T6, T7, T8 may be of equal size, it may be preferable to increase the sizes of each of the transistors T5, T6, T7, T8 step by step, so that each of the transistors T5, T6, T7, and T8 have different sizes. With the transistors of different sizes, impedance can be adjusted more accurately by changing the impedance at equal intervals when the selection signals are incremented.

Figure 8:
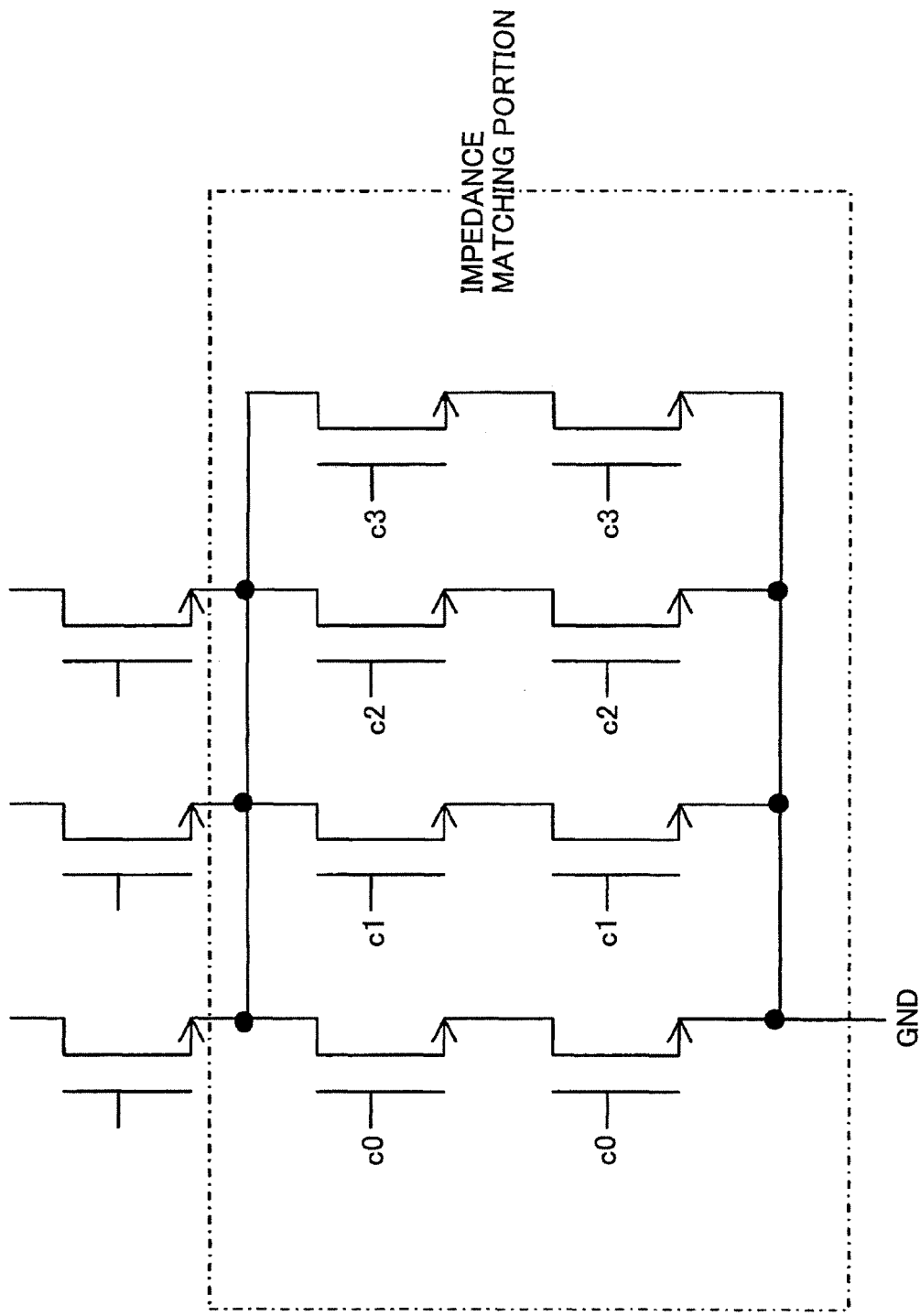
FIG. 8 is a schematic diagram showing an exemplary configuration of another impedance matching part according to an embodiment of the present invention.

It is to be noted that, although the impedance matching part 2 includes plural transistor parts connected in parallel (as shown in FIGS. 2 and 7) where each transistor part includes a single transistor, the impedance matching part 2 may alternatively include plural transistor parts connected in series as shown in FIG. 8.

FIG. 8 shows another exemplary configuration of the impedance matching part 2 having plural transistors serially connected in two rows. Selection signals the same as FIG. 7 are input to the gates of the serially connected transistors. In a case where "Vgs" is the gate voltage, "Vds" is the drain voltage, and "Vth" is the threshold voltage, the transistors exhibit a characteristic of having a linear area in the range of "Vds<Vgs−Vth". Such characteristic of the transistors is the same as that of a resistor. Accordingly, by connecting the transistors in series and reducing the drain voltage Vds as low as possible, the transistors can exhibit a characteristic of a resistor even when the drain voltage Vds changes.

Furthermore, although the above description describes the impedance matching part on the nch transistor side, the impedance matching part on the pch transistor is configured the same as the impedance matching part on the nch transistor side.

Furthermore, since the control part 3 includes the switching part 1 and the impedance matching part 2 which have the above-described configuration, the control part 3 has a control portion on the pch transistor side and another control portion (CTL 2) on the nch transistor side as shown in FIG. 2.

The control portion on the pch transistor side is configured to operate, for example, during initialization. The control portion on the pch transistor side includes a dummy pch transistor (MOS transistor) T13, a dummy resistor R5, a power supply I1, a comparator CMP1, and a controller CTL1. The power supply I1 supplies current to the serial connection between the dummy pch transistor T13, the dummy resistor R5, and the impedance matching portion on the pch transistor side (T9, T10, T11, T12). The comparator CMP1 compares a reference voltage with the voltage that is output when electric current is supplied to the serial connection between the dummy pch transistor T13, the dummy resistor R5, and the impedance matching portion on the pch transistor side (T9, T10, T11, T12). The controller CTL1 generates selection signals (c0, c1, c2, c3) of each transistor in the impedance matching portion on the pch transistor side based on the comparison results of the comparator CMP1 and performs various settings on the impedance matching portion on the pch transistor side.

Likewise, the control portion on the nch transistor side is configured to operate, for example, during initialization. The control portion on the nch transistor side includes a dummy nch transistor (MOS transistor) T14, a dummy resistor R6, a power supply I2, a comparator CMP2, and a controller CTL2. The power supply I2 supplies current to the serial connection between the dummy nch transistor T14, the dummy resistor R6, and the impedance matching portion on the nch transistor side (T5, T6, T7, T8). The comparator CMP2 compares a reference voltage with the voltage that is output when electric current is supplied to the serial connection between the dummy nch transistor T14, the dummy resistor R6, and the impedance matching portion on the nch transistor side (T5, T6, T7, T8). The controller CTL2 generates selection signals (c0, c1, c2, c3) of each transistor in the impedance matching portion on the nch transistor side based on the comparison results of the comparator CMP2 and controls the settings of the impedance matching portion on the nch transistor side.

Next, the impedance matching portions and the control portions on the pch transistor side and the nch transistor side are described in further detail. The control portion operates, for example, during initialization and controls the settings of the impedance matching portion (for example, the control portion sets the impedance matching portion by performing a calibration operation on the impedance matching portion during initialization). More specifically, in the control portion, a reference current is supplied to the serially connected dummy resistors, the dummy switch transistors, and the impedance matching portions, so that a voltage (output voltage) is output from an end of a resistor. The comparators CMP1 and the CMP2 output comparison results by comparing the output voltage and the reference voltage. The controllers CTL1 and CTL2 orderly increment the selection signals c0, c1, c2, c3 of the impedance matching portion so that the composite resistance values (composite impedance) are incremented from small to large or from large to small. The selection signals generated at the time when there is a match between the comparison result of the CMP1 and the comparison result of the CMP2 (for example, immediately after or immediately before the comparison results change from positive (negative) to negative (positive)) are loaded, for example, in a predetermined register or a memory. The composite resistance (composite impedance) of the impedance matching portion during this time is determined according to the reference current and the reference voltage. For example, the composite resistance of the impedance matching portion is 50Ω in a case where the reference current is 5 mA and the reference voltage is 250 mV. The selection signals generated at this time are applied to c0, c1, c2, and c3. Thereby, the impedance, which is output by the output apparatus when the switch transistor is switched on, can be set to a desired value.

Hence, the present invention provides plural transistors in the impedance matching portion, compares the output voltage of the transistors with a reference voltage, and sets the selection signals generated when the output voltage matches the reference voltage c0, c1, c2, c3 as the selection signals of the impedance matching portion. Accordingly, even in a case where there is a discrepancy of various elements (e.g. transistors, resistance), the impedance at the outputting end portion can be set to a desired value.

In FIG. 1, the auxiliary switching part 4 includes an electric current switching part 5 for supplying electric current to an output node(s), and absorbing electric current from the output node(s) and an auxiliary switching data generating part 6 for generating auxiliary switching data used for enabling the electric current switching part to perform the operations of supplying and absorbing electric current.

Furthermore, the auxiliary switching data generating part 6 includes a delay control voltage generating part 7 for generating delay control voltage and a delay data generating part 8 for generating auxiliary switching data in accordance with the delay control voltage.

Figure 9:
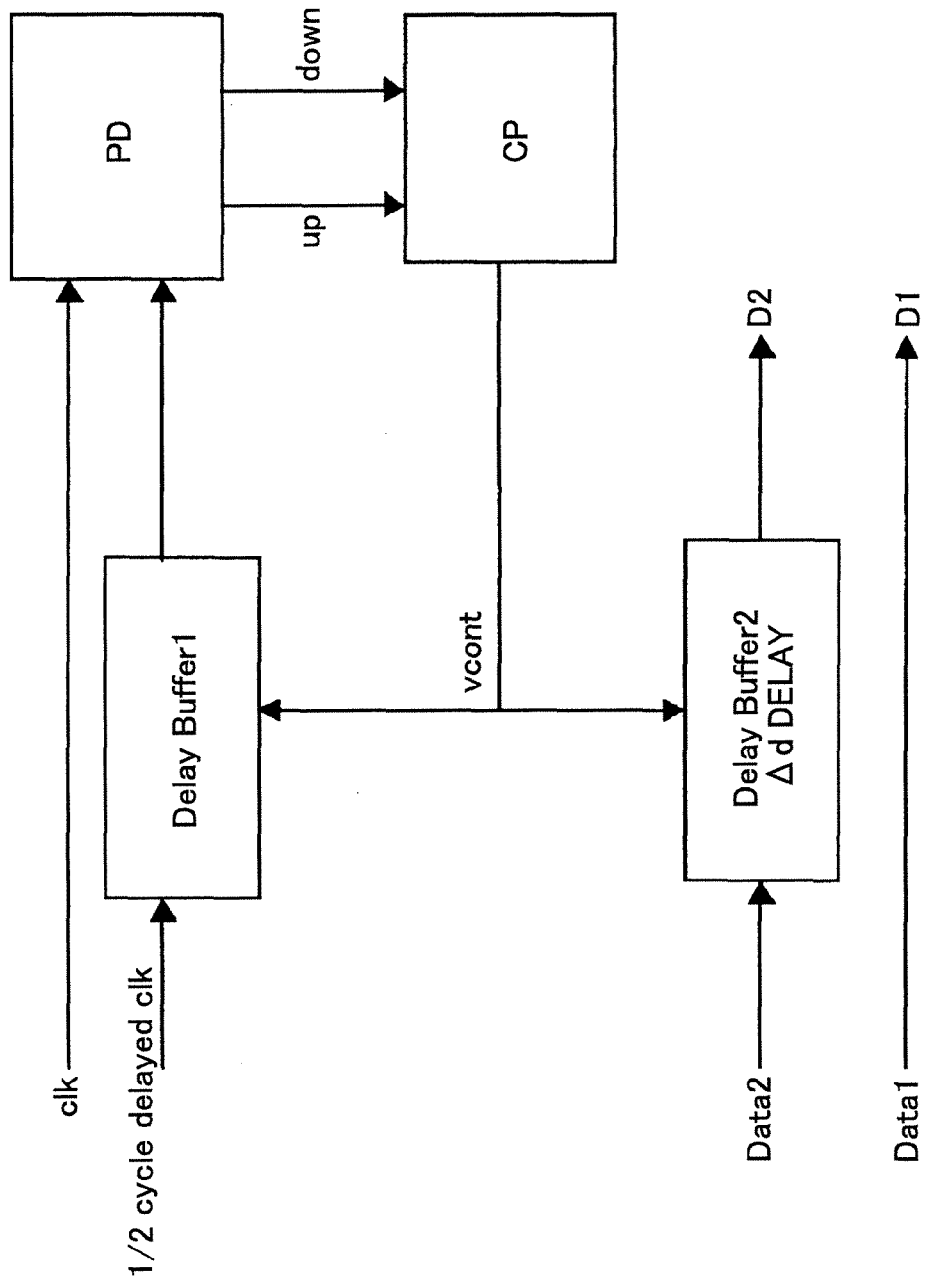
FIG. 9 is a schematic diagram showing a detail exemplary configuration of an auxiliary switching data generating part of FIG. 1.

FIG. 9 is a schematic diagram showing an exemplary configuration of the auxiliary switching data generating part 6. In FIG. 9, the auxiliary switching data generating part 6 includes a phase detector (PD), a delay buffer 1, a charge pump (CP), and a second delay buffer 2.

The delay control voltage generating part 7 in the auxiliary switching data generating part 6 is configured as a DLL (Delay Locked Loop) including a phase detector (PD), a delay buffer, and a charge pump (CP).

Figure 10:
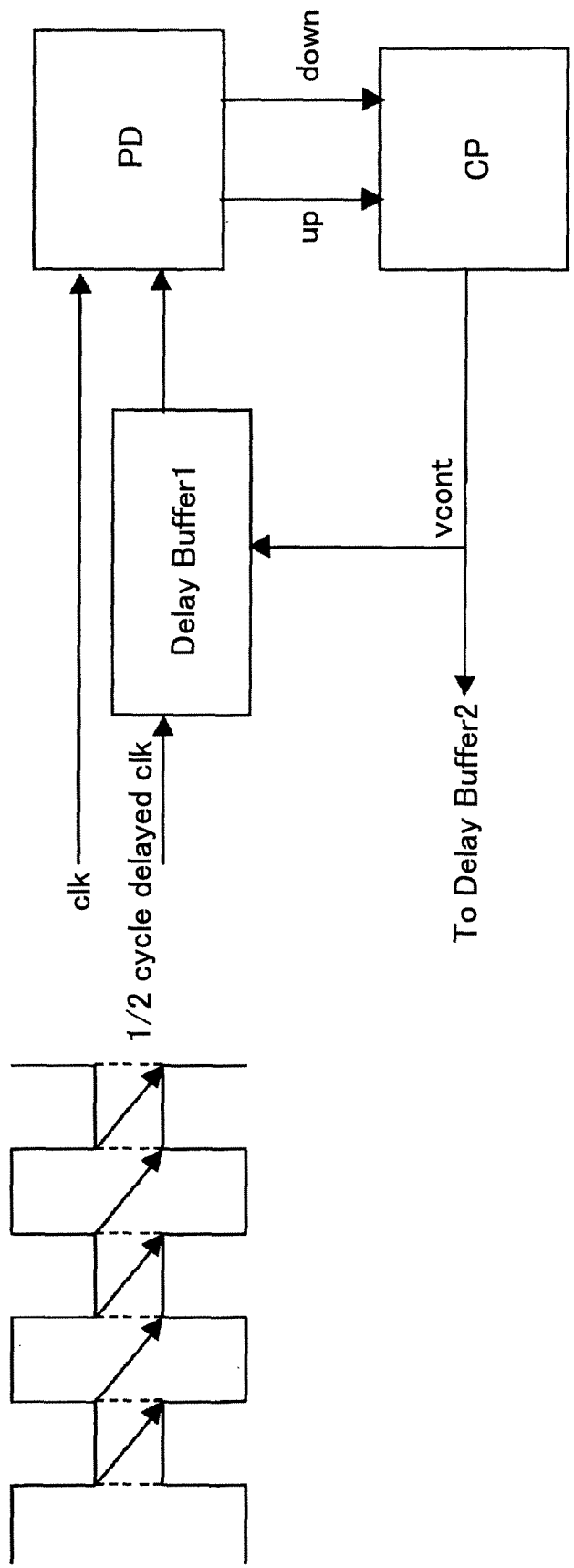
FIG. 10 is a schematic diagram for describing an operation of a DLL according to an embodiment of the present invention.

FIG. 10 is a schematic diagram for describing the operation of the delay locked loop (DLL) according to an embodiment of the present invention. In the delay locked loop shown in FIG. 10, a basic clock (e.g. clock of a serial electric transmission system) is input to one of the inputs of the phase detector (first input). Furthermore, a ½ cycle delayed clock, which is delayed ½ cycle with respect to the basic clock, is input to the delay buffer. Then, the output of the delay buffer is input to the other input of the phase detector (second input). In this example, the delay buffer can control the delay of the clocks in accordance with the values of a delay control voltage vcont (described below). Furthermore, the phase detector (PD) compares the phases of two inputs (first input, second input) and outputs an UP signal or a Down signal according to the comparison of the two inputs. The phase detector outputs an UP signal when the first input is faster than the second input and outputs a DOWN signal when the second input is faster than the first signal. Then, the UP signal or the DOWN signal is input to the charge pump (CP). The charge pump outputs a delay control voltage vcont in accordance with the UP signal/DOWN signal for controlling the delay buffers 1 and 2. That is, the charge pump functions to change the delay control voltage vcont in accordance with the UP signal and DOWN signal input from the phase detector. Thus, the DLL performs control for matching the phase of the clocks input to the phase detector. That is, the DLL performs control so that the clock input from the delay buffer 1 is delayed a ½ cycle.

Figure 11:
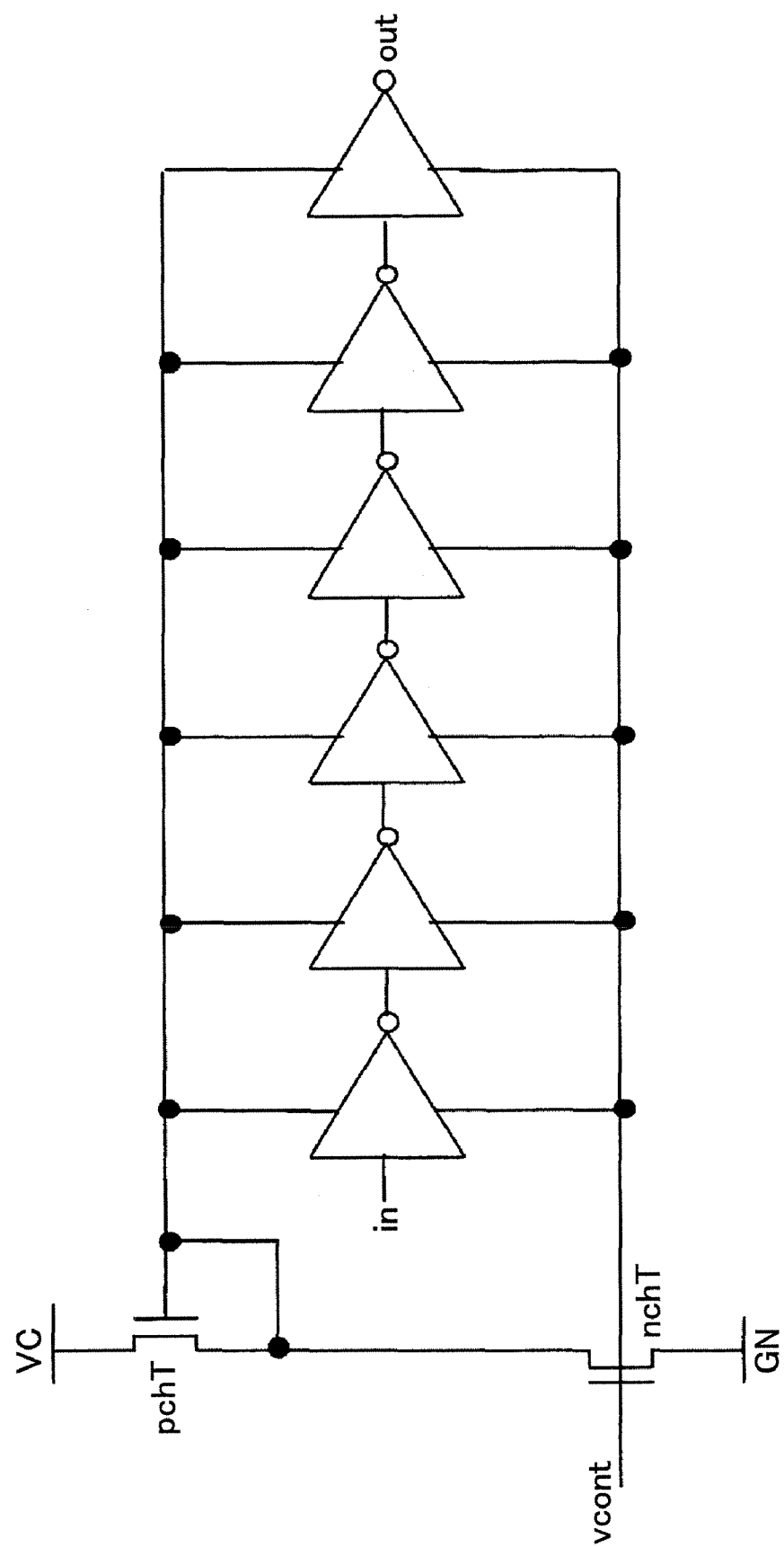
FIG. 11 is a schematic diagram showing a detail exemplary configuration of a delay buffer according to an embodiment of the present invention.
Figure 12:
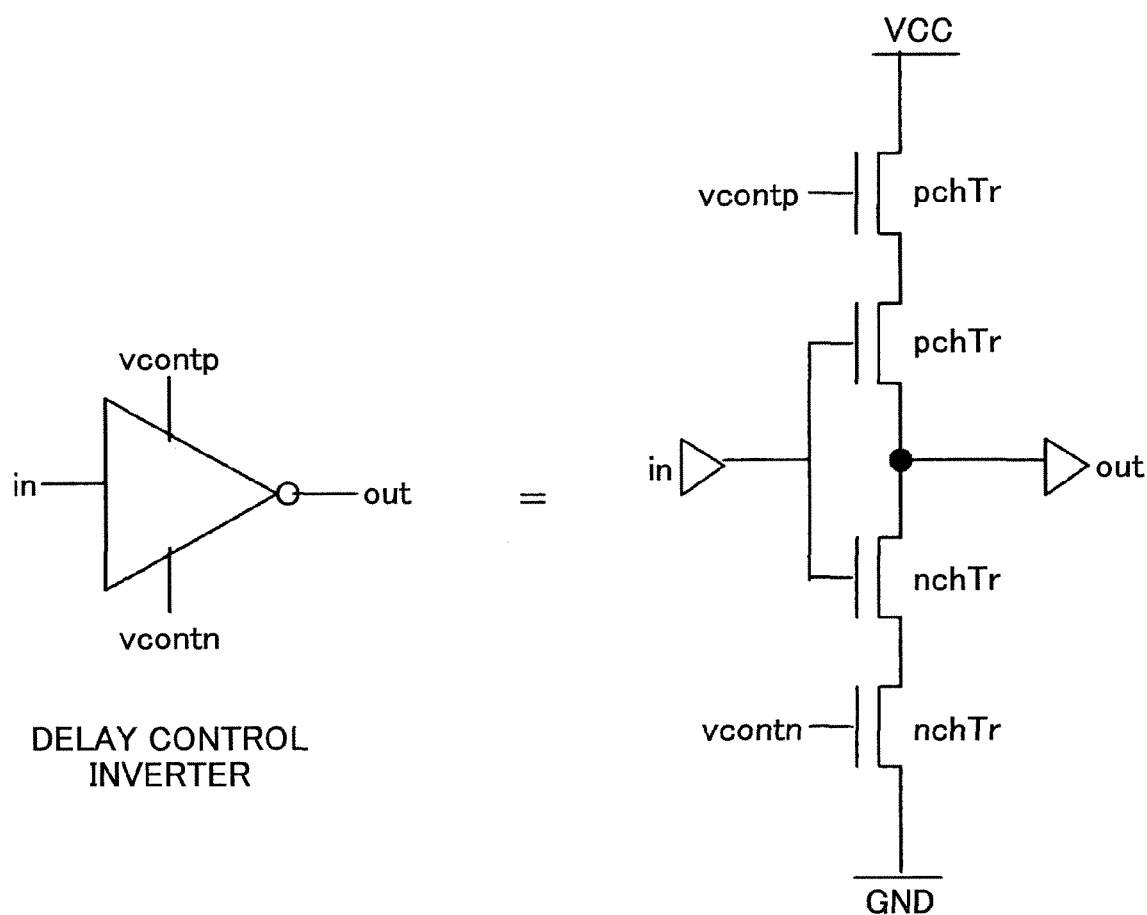
FIG. 12 is a schematic diagram showing an exemplary configuration of a delay control inverter used in FIG. 11.

FIG. 11 is a diagram showing an exemplary configuration of a delay buffer according to an embodiment of the present invention. FIG. 12 is a schematic diagram showing an exemplary configuration of a delay control inverter used in FIG. 11. The configuration shown in FIG. 11 has six steps of delay control inverters. The delay control inverter shown in FIG. 12 has a configuration of a normal inverter but with each of its nch Tr and pch Tr provided in two steps. The delay control inverter controls the gates of its outside transistors with a delay control voltages vcontp and vcontn and uses the gates as power supply sources. By increasing the electric current flowing in the power supply sources, the delay time can be reduced. By reducing the electric current flowing in the power supply sources, the delay time can be increased. By changing the delay control voltage in the delay control inverter, the electric current flowing in the delay control inverter can be changed and the delay between in and out can be changed.

The delay buffer 2 shown in FIG. 9 is provided in the delay data generating part 8 of the auxiliary switching data generating part 6.

Figure 13:
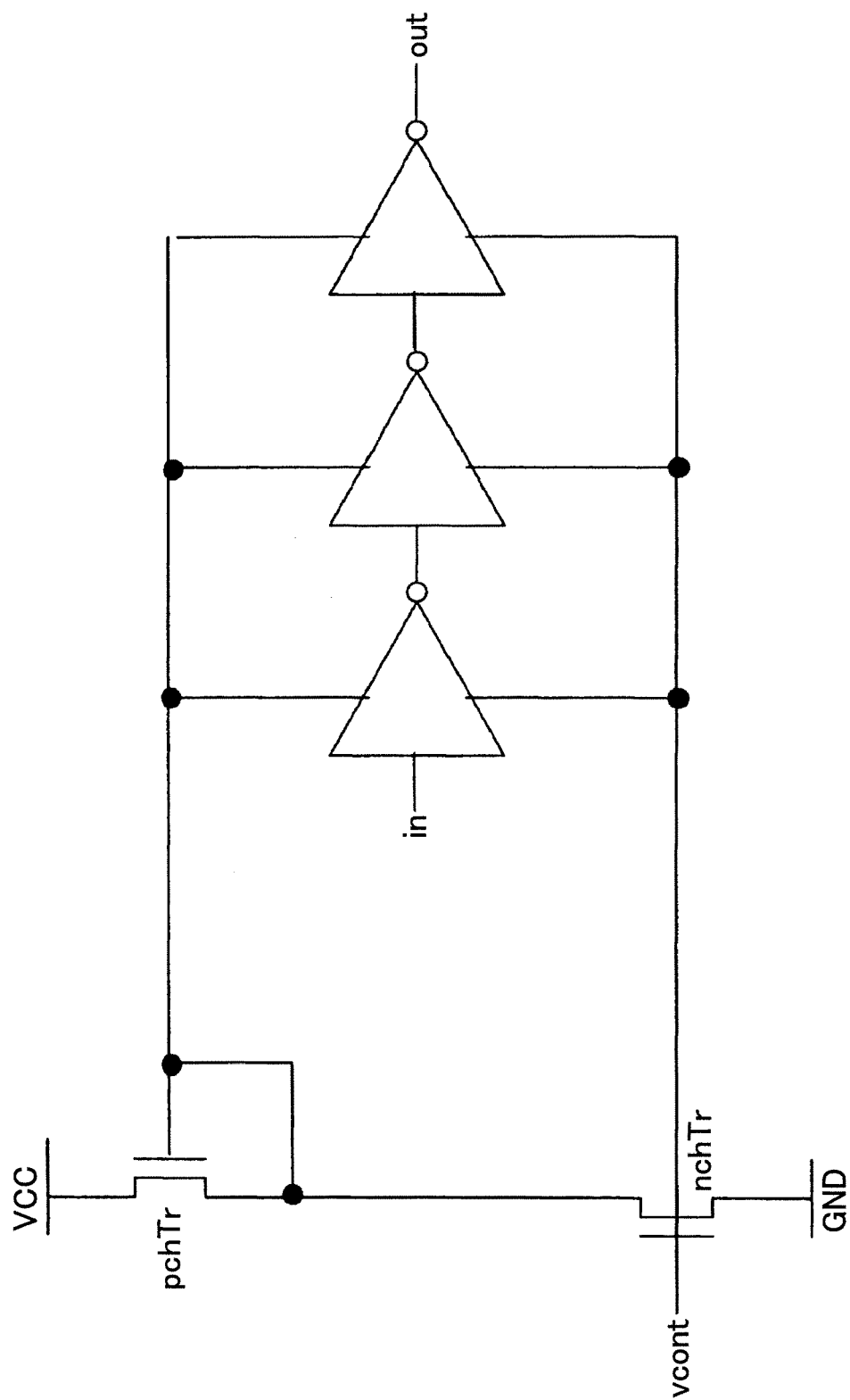
FIG. 13 is a schematic diagram showing an exemplary configuration of a delay buffer 2 corresponding to the delay buffer 1 shown in FIG. 11.

Next, an exemplary configuration of the delay buffer 2 provided in correspondence with the delay buffer 1 shown in FIG. 11 is described with reference to FIG. 13. The delay buffer 2 shown in FIG. 13 has the delay control inverter of FIG. 12 provided in a three step configuration. In this example, the delay control voltage vcont input to the delay buffer 2 is the delay control voltage vcont generated by the DLL shown in FIGS. 9 and 10 (i.e. the delay control voltage vcont so that the clock is delayed a ½ cycle in the delay buffer 1). Thereby, the delay time between the in and out of the delay buffer 2 becomes half of the delay time of the delay buffer 1. That is, the clock is delayed a ¼ cycle. Furthermore, by changing the number of steps of the delay control inverter, the delay time can be changed. Thus, in a case where the delay time of the delay buffer 2 is expressed as $\Delta d$, data delayed for $\Delta d$ with respect to a predetermined criterion can be generated since the data to be input to the gate of a switching transistor T51 (described below in FIG. 14) or the data to be input to the gate of a switching transistor T50 (described below in FIG. 15) are passed through the delay buffer 2.

This enables generation of data signals delayed for a length of $\Delta d$ being shorter than the fastest clock pulse width.

Figure 14:
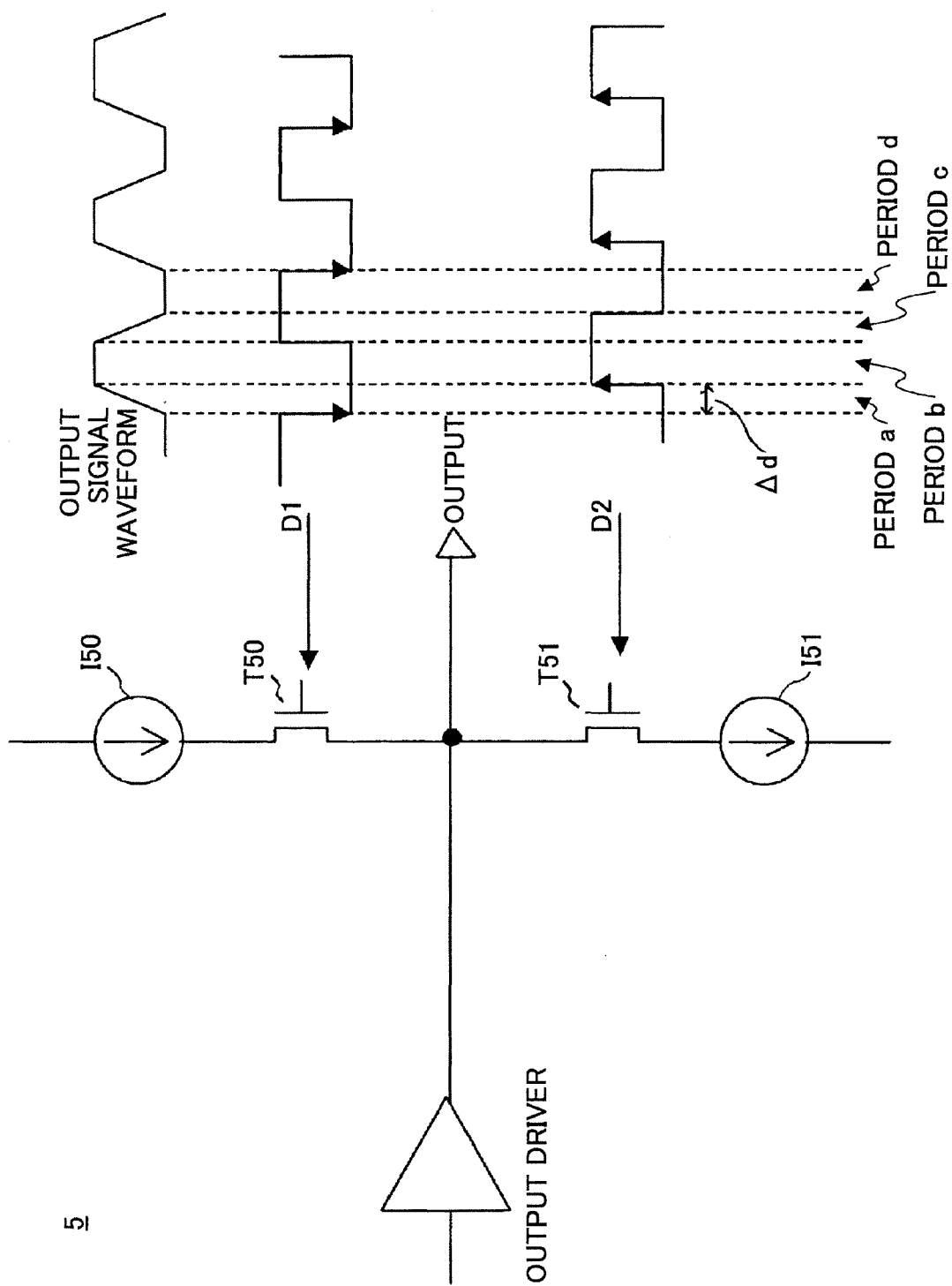
FIG. 14 is a schematic diagram showing a detail exemplary configuration of a current switching part 5 according to an embodiment of the present invention.
Figure 15:
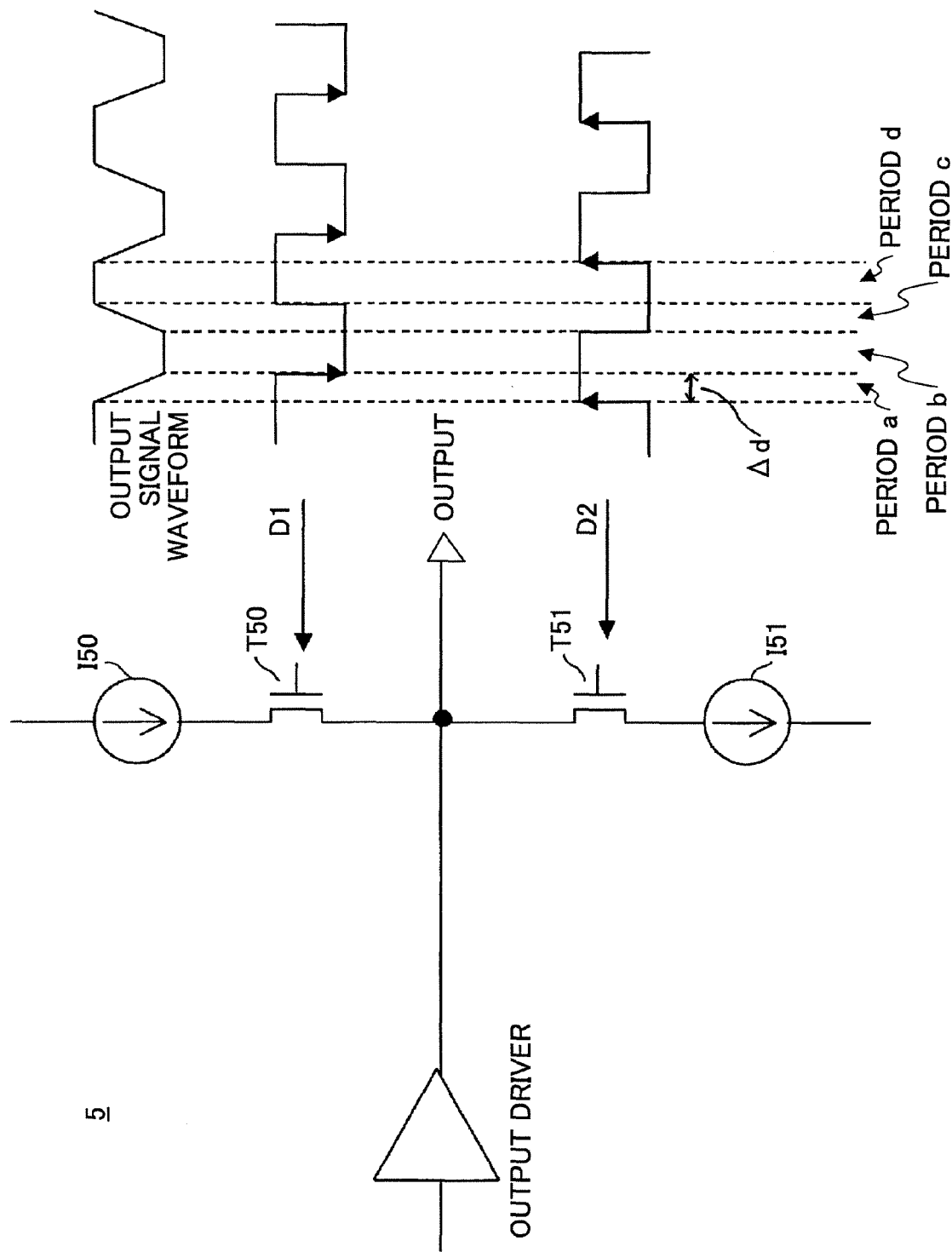
FIG. 15 is a schematic diagram showing another detail exemplary configuration of a current switching part 5 according to an embodiment of the present invention.

FIGS. 14 and 15 are schematic diagrams for describing the configuration of the electric current switching part 5. The electric current switching part 5 shown in FIG. 14 includes a P type current source I50 for subsidiarily supplying current to an output node, a switching-purpose pch transistor T50 (hereinafter referred to as "pch transistor T50") to which data D1 from the delay data generating part 8 shown in FIG. 9 are input, an N type current source I51 for subsidiarily absorbing current from an output node, and a switching-purpose nch transistor T51 (hereinafter referred to as "nch transistor T51") to which data D2 from the delay data generating part 8 (delay buffer 2) shown in FIG. 9 are input.

In FIG. 14, data D2 from the delay buffer 2 are input to the gate of the nch transistor T51. The input of the data D2 is delayed for $\Delta d$ with respect to the input of data D1 (inverse data). That is, the data D2 is input to the gate of the nch transistor T51 at a timing Δd later than the input of the data D1 to the gate of the pch transistor T50. In this case, the pch transistor T50 performs switching in synchronization with the switching of the output driver. Here, the amount of current supplied from the P type current source I50 and the amount of current supplied from the N type current source I51 are set to be substantially equal. Accordingly, since the pch transistor T50 is switched on while the data D1 is low and the nch transistor T51 is switched off while the data D2 is low during period A shown in FIG. 14, the P type current source I50 supplies current to the output node during the period A (rise period of output signal). Furthermore, the pch transistor T50 is switched on while the data D1 is low and the nch transistor T51 is switched on while the data D2 is high during period B. In this case, since the amount of current supplied from the P type current source I50 and the amount of current supplied from the N type current source I51 are equal, the current shoots through from the power supply voltage to ground (GND) so that there is no charging or discharging of charge to the output node during the period B (high period of output signal). Furthermore, since the pch transistor T50 is switched off while the data D1 is high and the nch transistor T51 is switched off while the data D2 is high during period c, the N type current source I51 absorbs current from the output node (drop period of output signal). Furthermore, since the pch transistor T50 is switched off while the data D1 is high and the nch transistor T51 is switched off while the data D2 is low during period d, there is no charging or discharging of charge to the output node during the period D (low period of output signal). With the configuration shown in FIG. 14, there is no need to generate a short pulse of Δd. Furthermore, current (auxiliary current) can be subsidiarily supplied to the output node or absorbed from the output node only during the periods where the output signal (i.e. waveform of the output signal) changes.

The electric current switching part 5 shown in FIG. 15 also includes a P type current source I50 for subsidiarily supplying current to an output node, a pch transistor T50 to which data D2 from the delay data generating part 8 (delay buffer 2) shown in FIG. 9 are input, an N type current source I51 for subsidiarily absorbing current from an output node, and a nch transistor T51 to which data D1 from the delay data generating part 8 shown in FIG. 9 are input.

In FIG. 15, data D2 from the delay buffer 2 are input to the gate of the pch transistor T50. The input of the data D2 is delayed for Δd with respect to the input of data D1 (inverse data). That is, the data D2 is input to the gate of the nch transistor T51 at a timing being Δd later than the input of the data D1 to the gate of the pch transistor T50. In this case, the pch transistor T50 performs switching in synchronization with the switching of the output driver. Here, the amount of current supplied from the P type current source I50 and the amount of current supplied from the N type current source I51 are set to be substantially equal. Accordingly, since the nch transistor T51 is switched on while the data D1 is high and the pch transistor T50 is switched off while the data D2 is high during period A shown in FIG. 15, the N type current source I50 absorbs current from the output node during the period A (drop period of output signal). Furthermore, the pch transistor T50 is switched on while the data D2 is low and the nch transistor T51 is switched on while the data D1 is high during period B. In this case, since the amount of current supplied from the P type current source I50 and the amount of current supplied from the N type current source I51 are equal, the current shoots through from the power supply voltage to ground (GND) so that there is no charging or discharging of charge to the output node during the period B (low period of output signal). Furthermore, since the nch transistor T51 is switched off while the data D1 is low and the pch transistor T50 is switched on while the data D2 is low during period c, the P type current source I50 supplies current to the output node (rise period of output signal). Furthermore, since the pch transistor T50 is switched off while the data D1 is low and the nch transistor T51 is switched off while the data D2 is high during period d, there is no charging or discharging of charge to the output node during the period D (high period of output signal). With the configuration shown in FIG. 15, there is no need to generate a short pulse of Δd. Furthermore, current (auxiliary current) can be subsidiarily supplied to the output node or absorbed from the output node only during the periods where the output signal (i.e. waveform of the output signal) changes.

The difference between FIGS. 14 and 15 is the period (i.e. the period where the output signal is high or the period where the output signal is low) in which current (through-current) shoots through from the power supply voltage to GND. Furthermore, although the output data of the above-described operation and configuration of the present invention shown in FIGS. 10-13 is explained in a case where data switches between 1 and 0 every single pulse width (1U1), the above-described operation and configuration of the present invention can be applied to other data patterns by generating input patterns for corresponding switching-purpose transistors.

Figure 16:
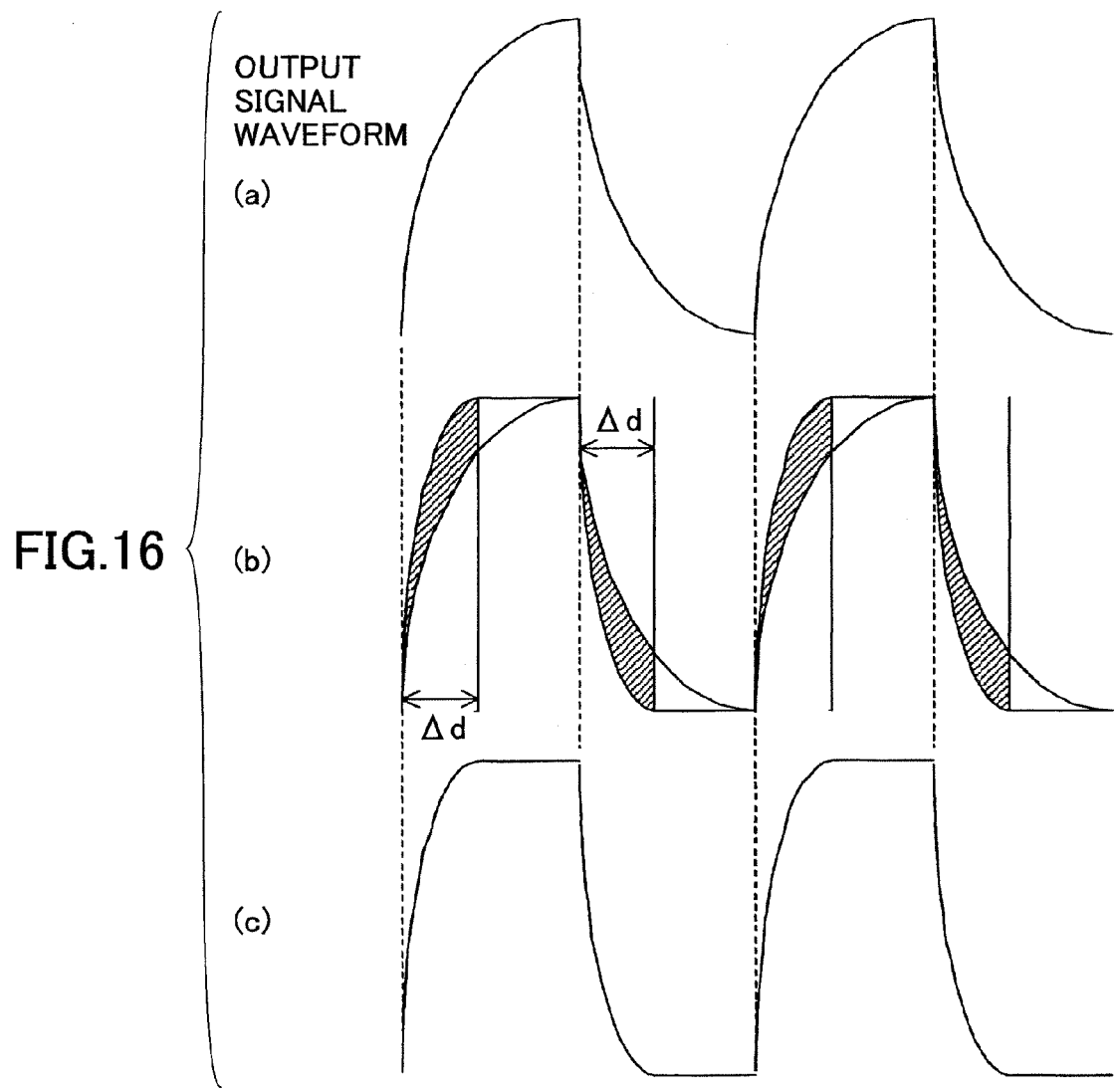
FIG. 16 is a schematic diagram for describing the behavior of the waveform of an output signal in a case where a current switching part 5 has the configuration shown in FIG. 14.

FIG. 16 is a schematic diagram for describing the behavior of the waveform of the output signal (how a waveform of an output signal is improved) in a case where the current switching part 5 has the configuration shown in FIG. 14. FIG. 16(a) shows a waveform of an output signal in a case where no auxiliary switching part 5 is provided (i.e. a case where only an output driver is used). In the case shown in FIG. 16(a), the waveform of the output signal has not completely reached a high or a low electric potential during a single data pulse width (1U1). Furthermore, in such a case, it becomes difficult for the receiver side to accurately detect data in a case where jitter is large. Therefore, in a case where an auxiliary current is supplied by the current sources I50, I51 for a period of Δd from the time of starting the switching operation (as shown in FIG. 16(b)), the waveform of the output signal has a shape similar to a square wave (as shown in FIG. 16(c)). The amount of charge of the supplied auxiliary current corresponds to the area shaded with diagonals lines between the period Δd in FIG. 16(b). It is however to be noted that there is a possibility that the amplitude of the output signal may increase in a case where the period Δd becomes substantially the same length as the width of a single data pulse (1U1). In such case where Δd becomes substantially equal to 1U1, the output signal becomes similar to a case of having the function of emphasis. Therefore, the period Δd needs to be shorter than the time required for the output signal to reach a desired voltage (amplitude).

Normally, in such system, the pulse width of the fastest clock cannot be made shorter than the period Δd. Even if the pulse width of the fastest clock could be made shorter than the period Δd, there is a possibility that the switch or the current source cannot respond sufficiently. That is, normally, a pulse based on a clock is used for switching a transistor on and off. Thus, it is difficult to control a transistor(s) with a resolution smaller than the fastest clock in the system. Furthermore, in a case where the output apparatus is a simple switching circuit, the switching speed is confined to a CR time constant (product of output impedance R and added capacity C) and cannot be increased any further than the CR time constant. Accordingly, the present invention is effective in solving such problems.

That is, the present invention serves to solve the problems by generating a delay of $\varDelta$d by inputting a delay control voltage vcont from the DLL to the delay buffer 2 so that the input of the data D1, D2 to the switching-purpose transistors is delayed. By switching the switching-purpose transistors on and off with the data D1, D2, the speed of the rise or drop of the output signal can be increased.

With the present invention, the output driver, in a regular case, performs switching in accordance with data. However, in a case where a sufficiently fast rise or a sufficiently fast initial drop cannot be attained with respect to a single data pulse width (1U1) (for example, due to the influence of load capacity), the auxiliary switching part 4 subsidiarily supplies or absorbs current at the moment of switching. By doing so, the switching can be responsive to a case where the output signal is increased to high speed.

Figure 17:
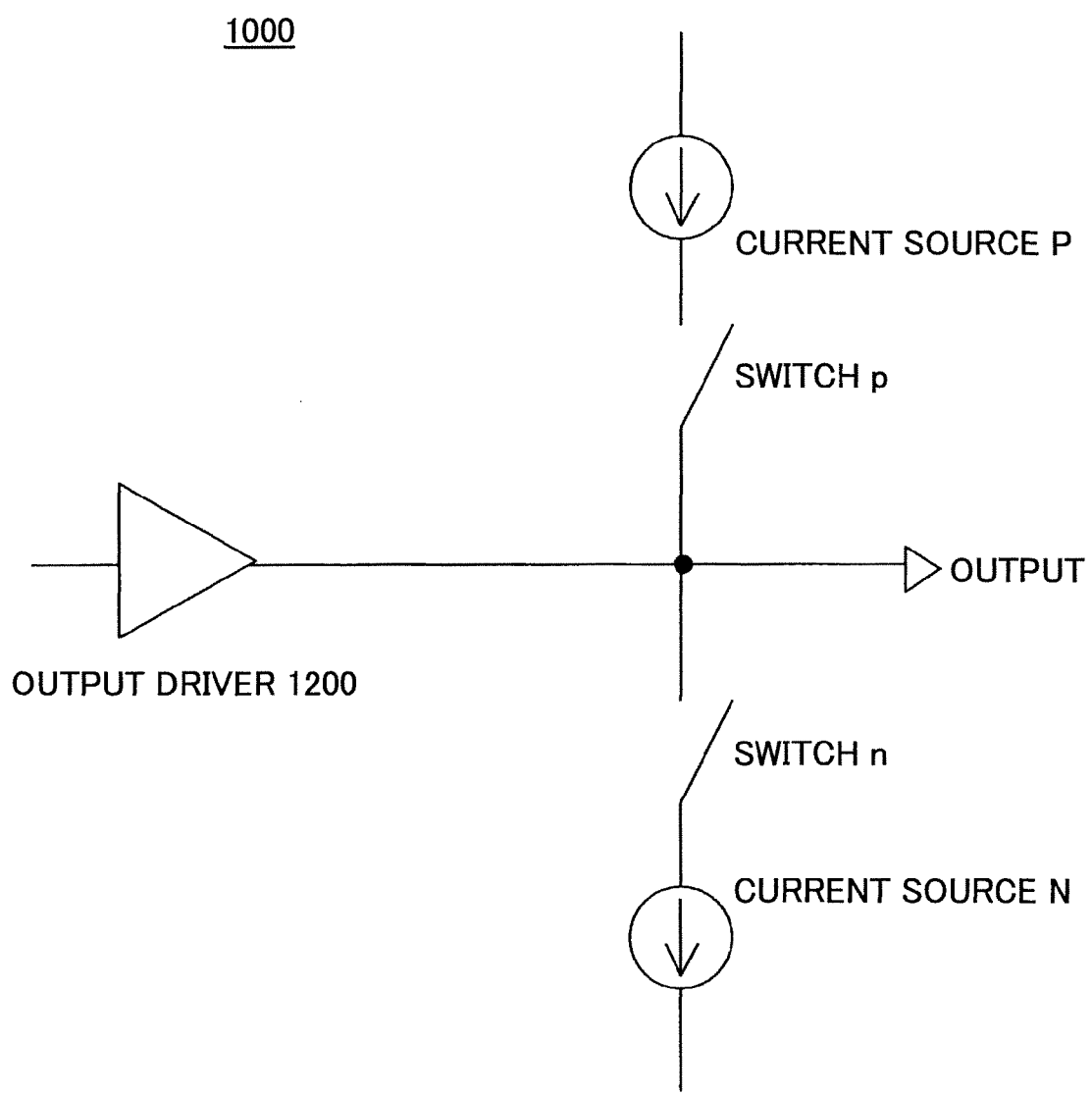
FIG. 17 is a conceptual diagram of an electric signal outputting apparatus according to an embodiment of the present invention.

FIG. 17 is a conceptual diagram of an electric signal outputting apparatus 1200 in a serial electric transmission system 1000 according to an embodiment of the present invention. The electric signal outputting apparatus 1200 includes an output driver, a current source P, a first switch p, a current source N, and a second switch n. In this example, the output driver has an impedance matching the transmission path. The current source P supplies current to the output node when the switch p is switched on. The current source N absorbs current from the output node when the switch n is switched on. Accordingly, high speed switching can be achieved by supplying and absorbing current at the moment when there is a change of data. Thus, output signals can be increased to high speed. Furthermore, by supplying and absorbing current with the current source, auxiliary current can be delivered without having to change output impedance (the output impedance of the current source is high impedance).

Furthermore, the above-described electric signal outputting apparatus according to an embodiment of the present invention can be used in a semiconductor laser modulation driving apparatus having a semiconductor laser driving part and a semiconductor laser modulating part in a case where the semiconductor laser driving part and the semiconductor laser modulating part of the semiconductor laser modulation driving apparatus are each provided on separate chips (e.g. integrated circuits). More specifically, the above-described electric signal outputting apparatus according to an embodiment of the present invention can be used for signal transmission between the semiconductor laser driving part and the semiconductor laser modulating part.

Figure 18:
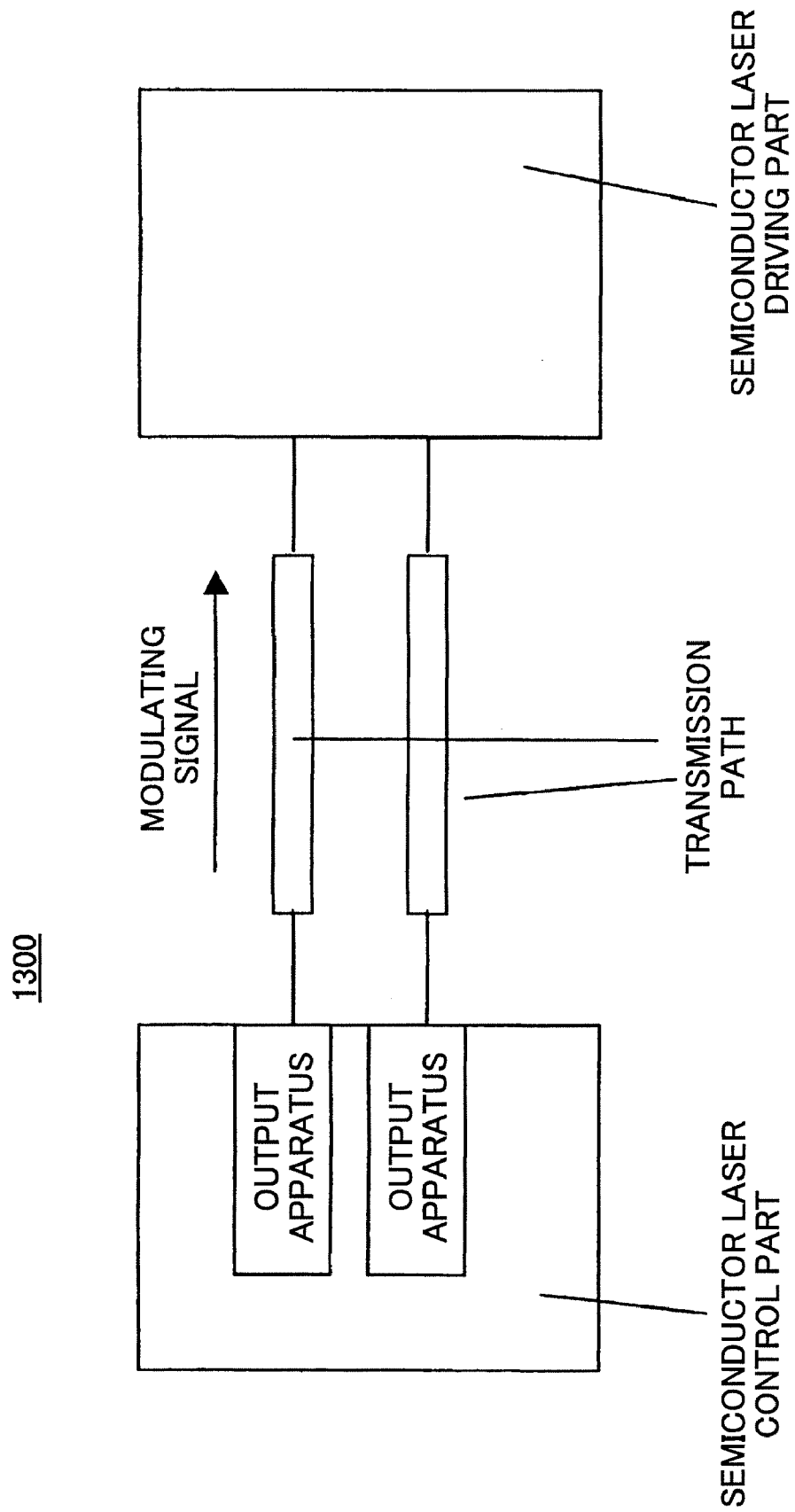
FIG. 18 is a schematic diagram showing an exemplary configuration of a semiconductor laser modulation driving apparatus employing the electric signal outputting apparatus according to an embodiment of the present invention.

FIG. 18 is a schematic diagram showing an exemplary configuration of a semiconductor laser modulation driving apparatus 1300 employing the electric signal outputting apparatus 1200 according to an embodiment of the present invention. In a case where a semiconductor laser driving part and a semiconductor laser modulating part (semiconductor laser control part) are provided into separate integrated circuits, signal transmission between the integrated circuits would be required. In such case, signals with little reflection can be accurately transmitted at high speed by using the electric signal outputting apparatus in an output part of the semiconductor laser control part.

Furthermore, the above-described electric signal outputting apparatus 1200 according to an embodiment of the present invention can be used in an image forming apparatus 1400 which conducts electric signal transmission including serial electric signal transmission between chips (e.g. integrated circuits) or between boards (e.g. printed circuit boards (PCB). That is, the above-described electric signal outputting apparatus 1200 or a semiconductor laser modulation driving apparatus 1300 including the electric signal outputting apparatus can be mounted in an image forming apparatus for conducting electric signal transmission between chips (e.g. integrated circuits) or between boards (e.g. printed circuit boards (PCB).

Figure 19:
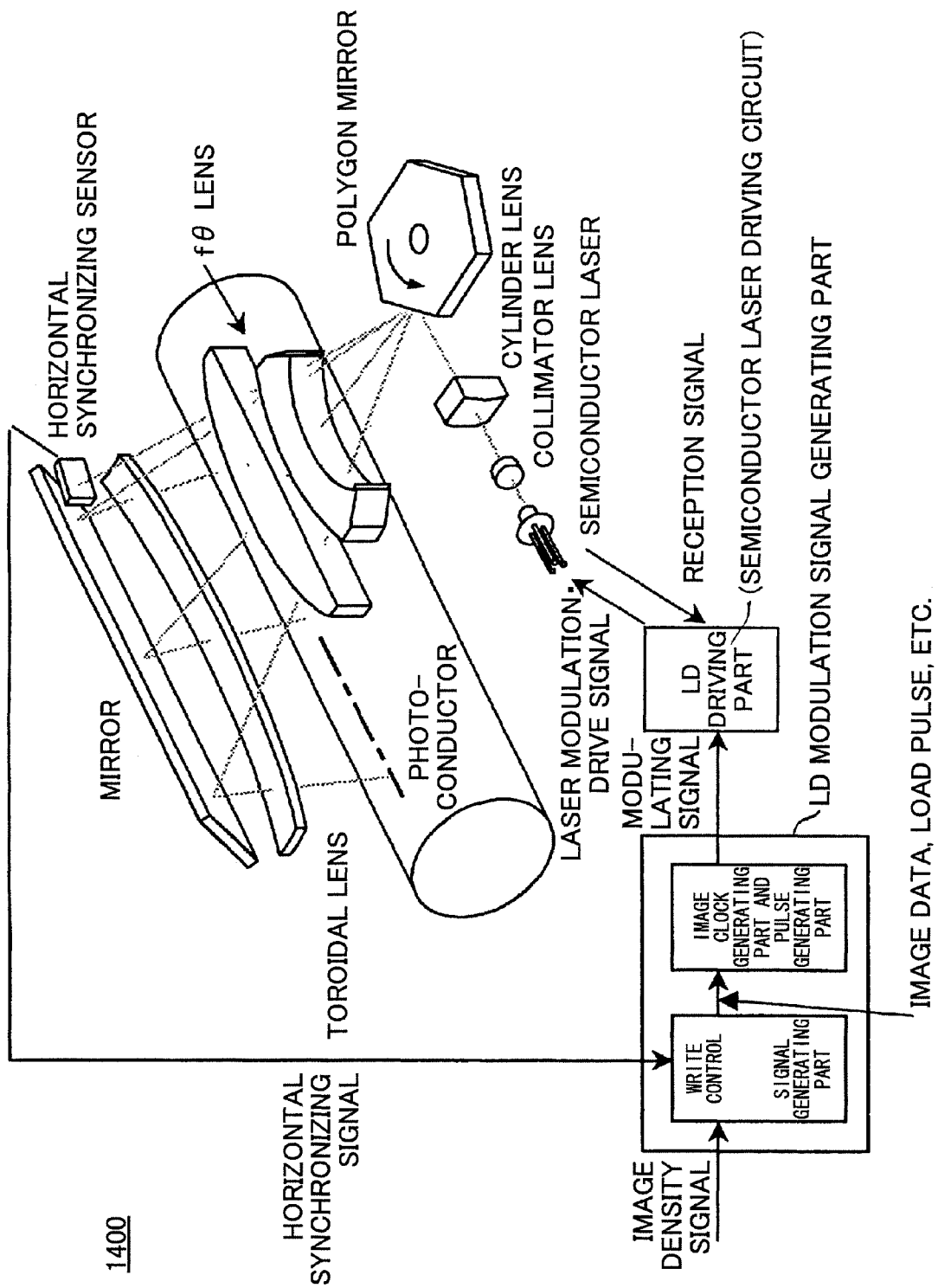
FIG. 19 is a schematic diagram showing an exemplary configuration of a raster scanning type image forming apparatus employing the electric signal outputting apparatus according to an embodiment of the present invention.

FIG. 19 is a schematic diagram showing an exemplary configuration of a raster scanning type image forming apparatus 1400 employing the electric signal outputting apparatus 1200 according to an embodiment of the present invention. In FIG. 19, the LD modulation signals generated in the LD modulation signal generating part are input to a semiconductor laser driving circuit for modulating the light of a semiconductor laser. The modulated laser light is input to a polygon mirror via a collimator lens and a cylinder lens, is deflected by the polygon mirror, and is incident on a photoconductor via an fθ lens. A horizontal synchronizing sensor detects the position for starting a writing operation and outputs horizontal synchronizing signals in accordance with the detected results. The horizontal synchronizing signals are input to an image processing part (not shown) and the LD modulation signal generating part. In accordance with the horizontal synchronizing signals from the horizontal synchronizing sensor and image signals (e.g. image density signals) from the image processing part, the LD modulation signal generating part outputs LD modulating signals therefrom. The write control signal generating part in the LD modulation signal part shown in FIG. 19 has a function of generating not only image data but also write control signals (e.g. counter signals in the main scanning direction and in the sub-scanning direction).

Accordingly, the electric signal outputting apparatus 1200 according to an embodiment of the present invention can be applied to the image forming apparatus 1400 shown in FIG. 19 for transmitting modulating signals from, for example, from the image clock generating part and the pulse generating part to the LD driving part. Thereby, modulating signals can be accurately transmitted at high speed with little reflection.

Figure 20:
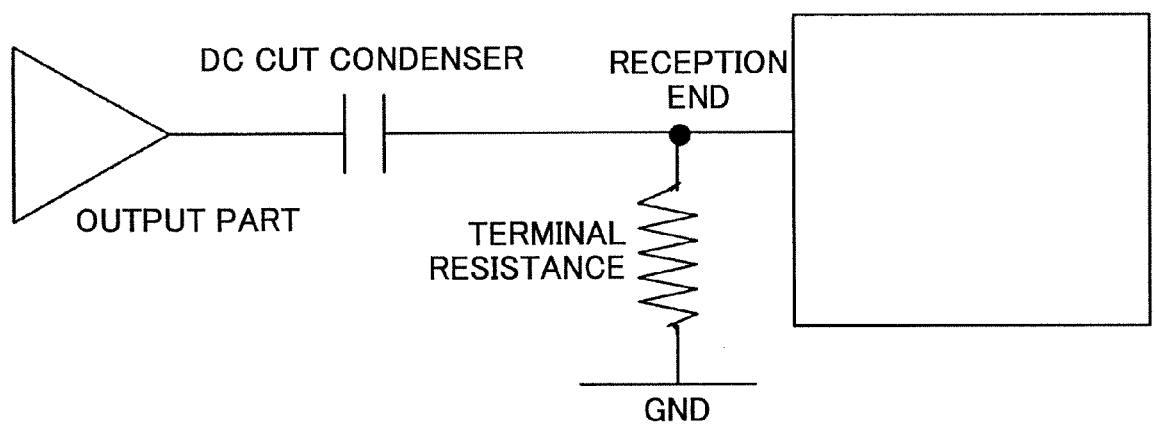
FIG. 20 is a schematic diagram showing a DC cut condenser provided in a transmission path according to an embodiment of the present invention.

Furthermore, as shown in FIG. 20, the transmission path according to an embodiment of the present invention may be provided with a DC cut condenser so that a DC cut is conducted between the sender side and the receiver side. However, the DC condenser is to have a sufficient capacity for enabling signal components to be transmitted therethrough. Furthermore, although the circuit diagram shown is terminal with respect to GND in FIG. 20, the same effect can be attained where the circuit is terminal with respect to the supply voltage.

Hence, the present invention can provide an electric signal outputting apparatus that can increase the initial rise or the initial drop of signals transmitted between integrated circuits or between printed circuit boards (PCB), to thereby accommodate increase to high speed. Furthermore, the present invention can provide a semiconductor laser modulation driving apparatus and an image forming apparatus that uses the aforementioned electric signal outputting apparatus.

Second Example

Figure 21:
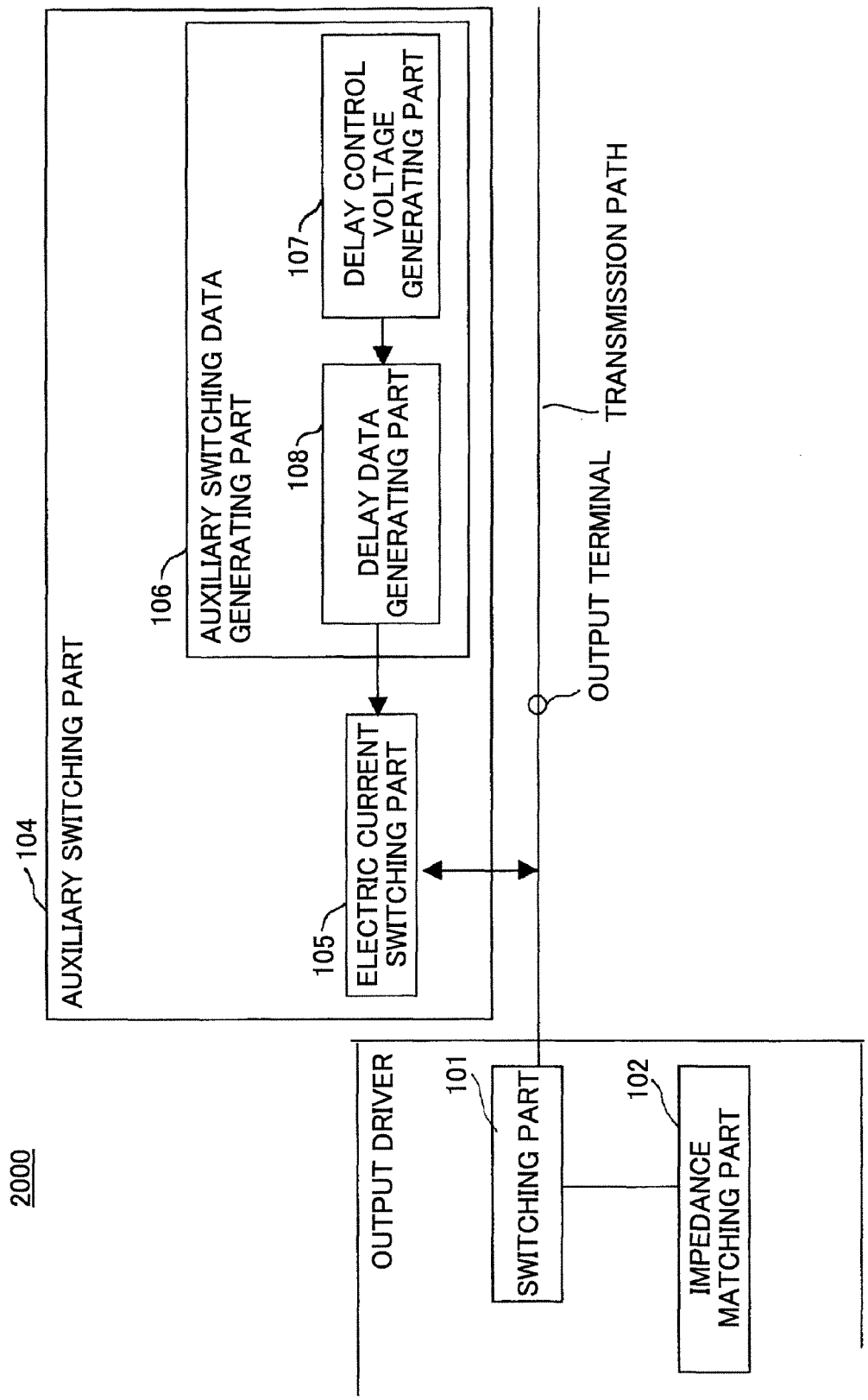
FIG. 21 is a schematic diagram showing an exemplary configuration of an electric signal outputting apparatus according to an embodiment of the present invention.

FIG. 21 shows an exemplary configuration of an electric signal outputting apparatus 2200 in a serial electric transmission system 2000 according to an embodiment of the present invention. The electric signal outputting apparatus 2200 according to this embodiment of the present invention is used for a serial electric transmission system 2000 and includes a switching part 1 for switchably generating high and low output signals in accordance with signal data and transmitting the output signals to a transmission path (output node) connected to, for example, a serial electric transmission system 2000, an impedance matching part 2 for matching an output impedance to the impedance of the transmission path, the impedance matching part including a reference voltage generating part and a terminal part controlled in accordance with a voltage generated by the reference voltage generating part, and an auxiliary switching part for subsidiarily supplying current to an output node in the transmission path and subsidiarily absorbing current from the output node in the transmission path when the switching part 1 switches the generation between high and low output signals, wherein the auxiliary switching part 4 conducts the supplying and the absorbing for a period shorter than a pulse width of a reference clock of the serial electric transmission system 2000.

In this example, the impedance of the transmission path includes the impedance of the transmission path anticipated by the sender side and the impedance input to the receiver side (hereinafter simply referred to as "impedance of the transmission path").

In FIG. 21, the auxiliary switching part 104 includes an electric current switching part 105 for supplying electric current to an output node(s), and absorbing electric current from the output node(s) and an auxiliary switching data generating part 106 for generating auxiliary switching data used for enabling the electric current switching part to perform the operations of supplying and absorbing electric current.

Furthermore, the auxiliary switching data generating part 106 includes a delay control voltage generating part 107 for generating delay control voltage and a delay data generating part 108 for generating auxiliary switching data in accordance with the delay control voltage.

Figure 22:
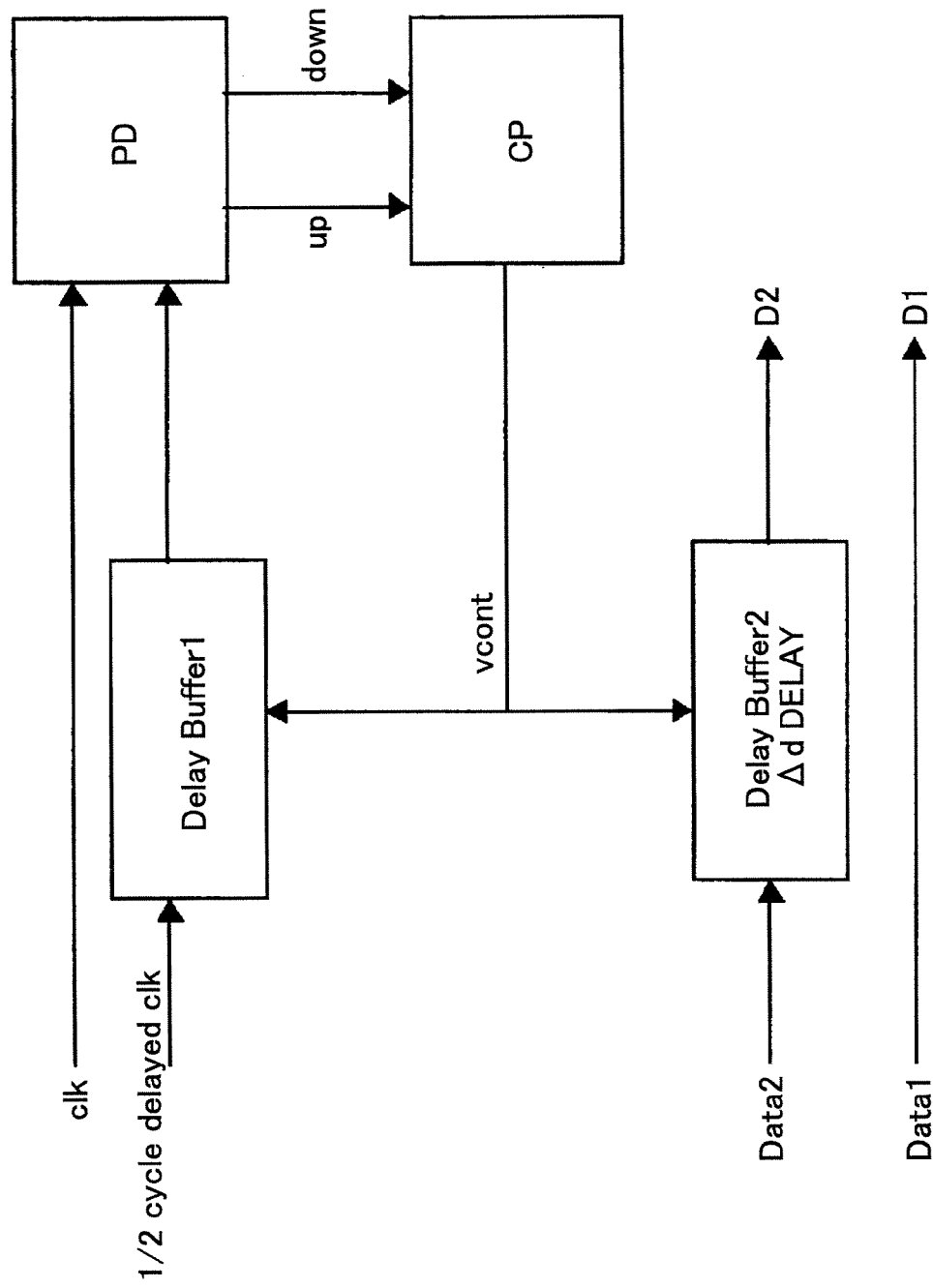
FIG. 22 is a schematic diagram showing a detail exemplary configuration of an auxiliary switching data generating part of FIG. 21.

FIG. 22 is a schematic diagram showing an exemplary configuration of the auxiliary switching data generating part 106. In FIG. 22, the auxiliary switching data generating part 106 includes a phase detector (PD), a delay buffer 101, a charge pump (CP), and a second delay buffer 102.

The delay control voltage generating part 107 in the auxiliary switching data generating part 106 is configured as a DLL (Delay Locked Loop) including a phase detector (PD), a delay buffer, and a charge pump (CP).

Figure 23:
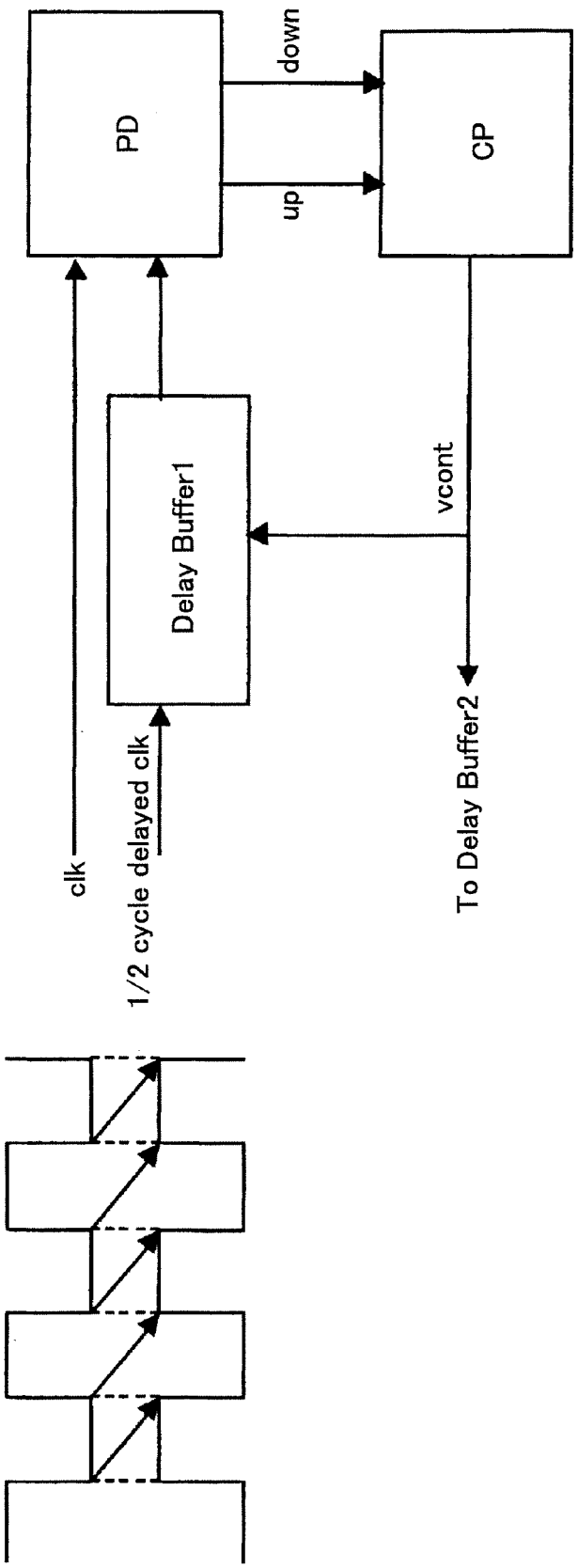
FIG. 23 is a schematic diagram for describing an operation of a DLL according to an embodiment of the present invention.

FIG. 23 is a schematic diagram for describing the operation of the delay locked loop (DLL) according to an embodiment of the present invention. In the delay locked loop shown in FIG. 23, a basic clock (clk) is input to one of the inputs of the phase detector (first input). Furthermore, a ½ cycle delayed clock, which is delayed ½ cycle with respect to the basic clock, is input to the delay buffer. Then, the output of the delay buffer is input to the other input of the phase detector (second input). In this example, the delay buffer can control the delay of the clocks in accordance with the values of a delay control voltage vcont (described below). Furthermore, the phase detector (PD) compares the phases of two inputs (first input, second input) and outputs an UP signal or a Down signal according to the comparison of the two inputs. The phase detector outputs an UP signal when the first input is faster than the second input and outputs a DOWN signal when the second input is faster than the first signal. Then, the UP signal or the DOWN signal is input to the charge pump (CP). The charge pump outputs a delay control voltage vcont in accordance with the UP signal/DOWN signal for controlling the delay buffers 1 and 2. That is, the charge pump functions to change the delay control voltage vcont in accordance with the UP signal and DOWN signal input from the phase detector. Thus, the DLL performs control for matching the phase of the clocks input to the phase detector. That is, the DLL performs control so that the clock input from the delay buffer 1 is delayed a ½ cycle.

Figure 24:
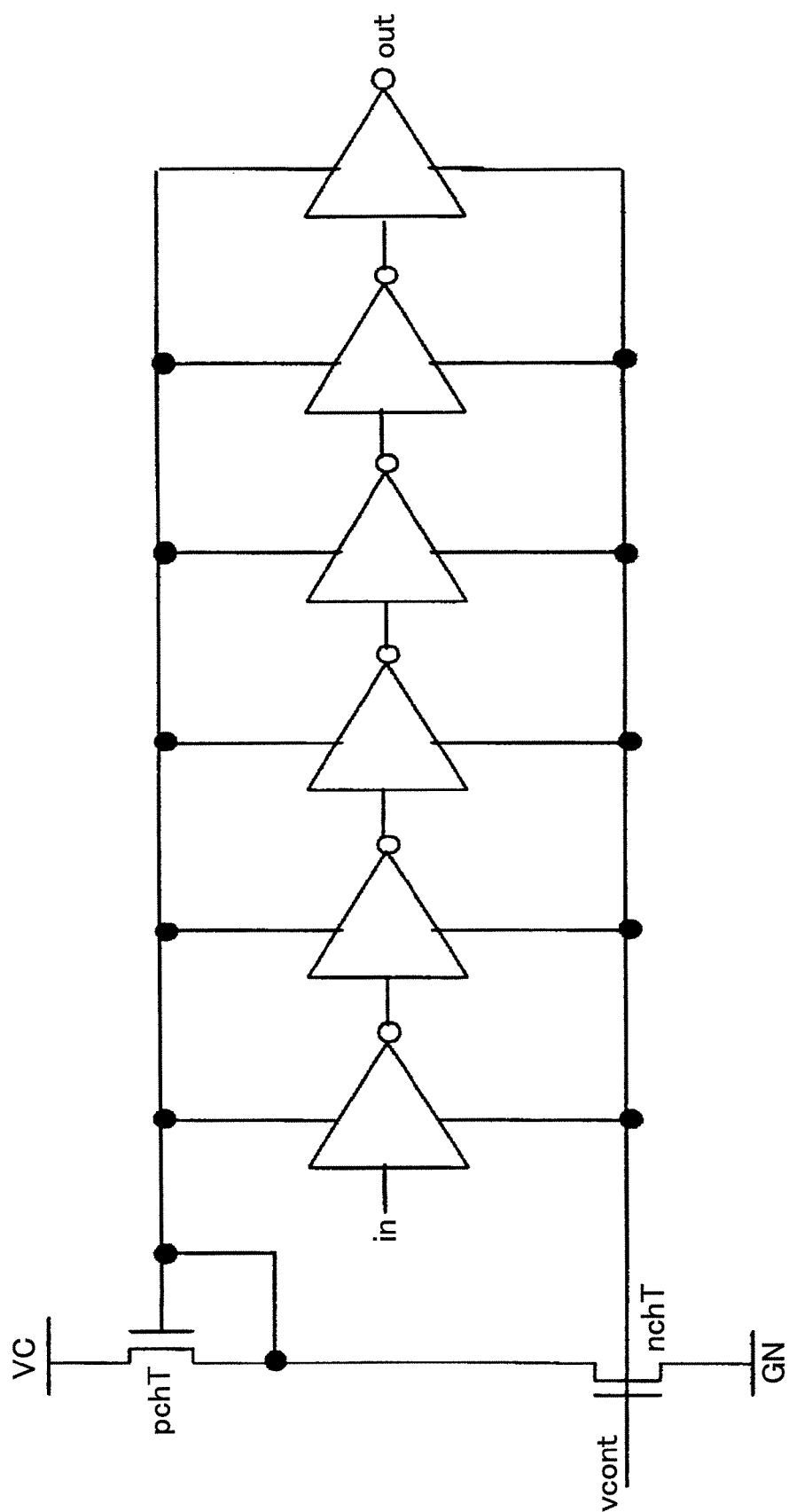
FIG. 24 is a schematic diagram showing a detail exemplary configuration of a delay buffer according to an embodiment of the present invention.
Figure 25:
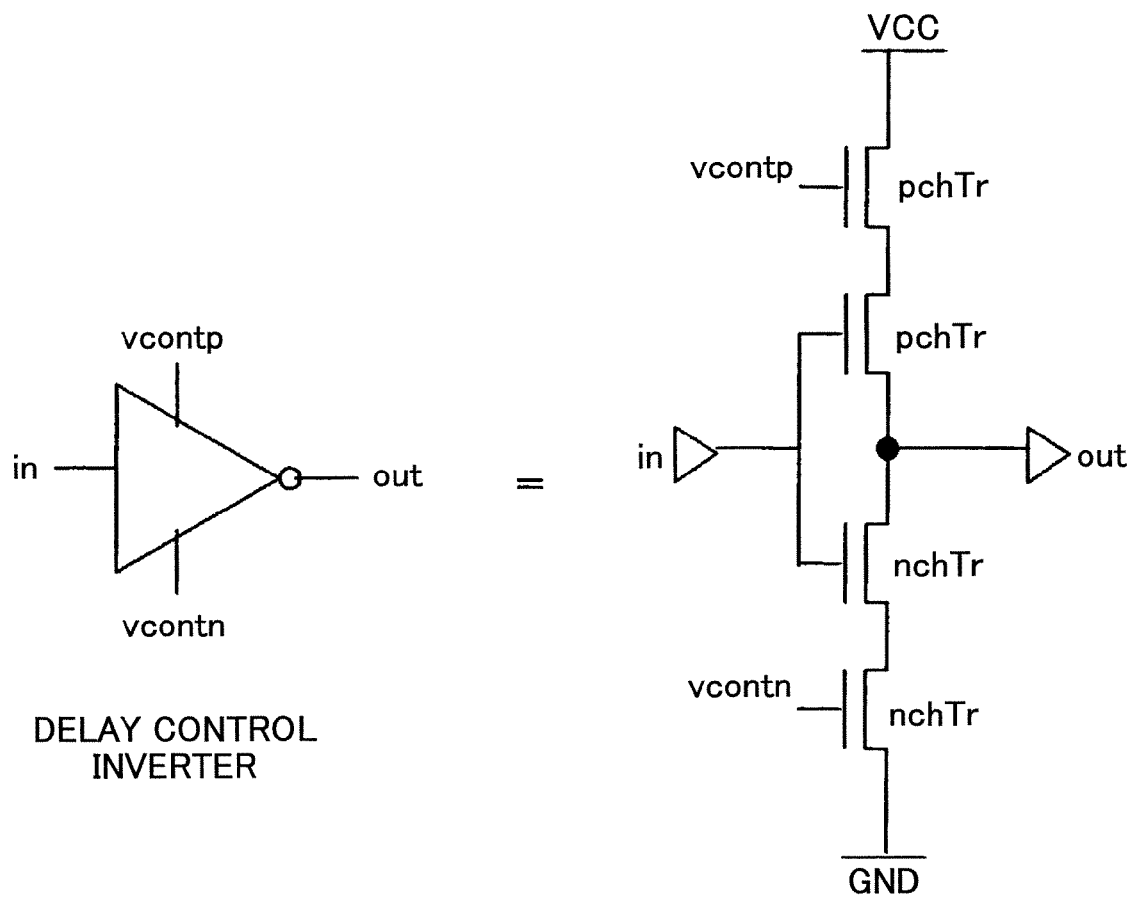
FIG. 25 is a schematic diagram showing an exemplary configuration of a delay control inverter used in FIG. 24.

FIG. 24 is a diagram showing an exemplary configuration of a delay buffer according to an embodiment of the present invention. FIG. 25 is a schematic diagram showing an exemplary configuration of a delay control inverter used in FIG. 24. The configuration shown in FIG. 24 has six steps of delay control inverters. The delay control inverter shown in FIG. 25 has a configuration of a normal inverter but with each of its nch Tr and pch Tr provided in two steps. The delay control inverter controls the gates of its outside transistors with a delay control voltages vcontp and vcontn and uses the gates as power supply sources. By increasing the electric current flowing in the power supply sources, the delay time can be reduced. By reducing the electric current flowing in the power supply sources, the delay time can be increased. By changing the delay control voltage in the delay control inverter, the electric current flowing in the delay control inverter can be changed and the delay between in and out can be changed.

The delay buffer 2 shown in FIG. 22 is provided in the delay data generating part 108 of the auxiliary switching data generating part 106.

Figure 26:
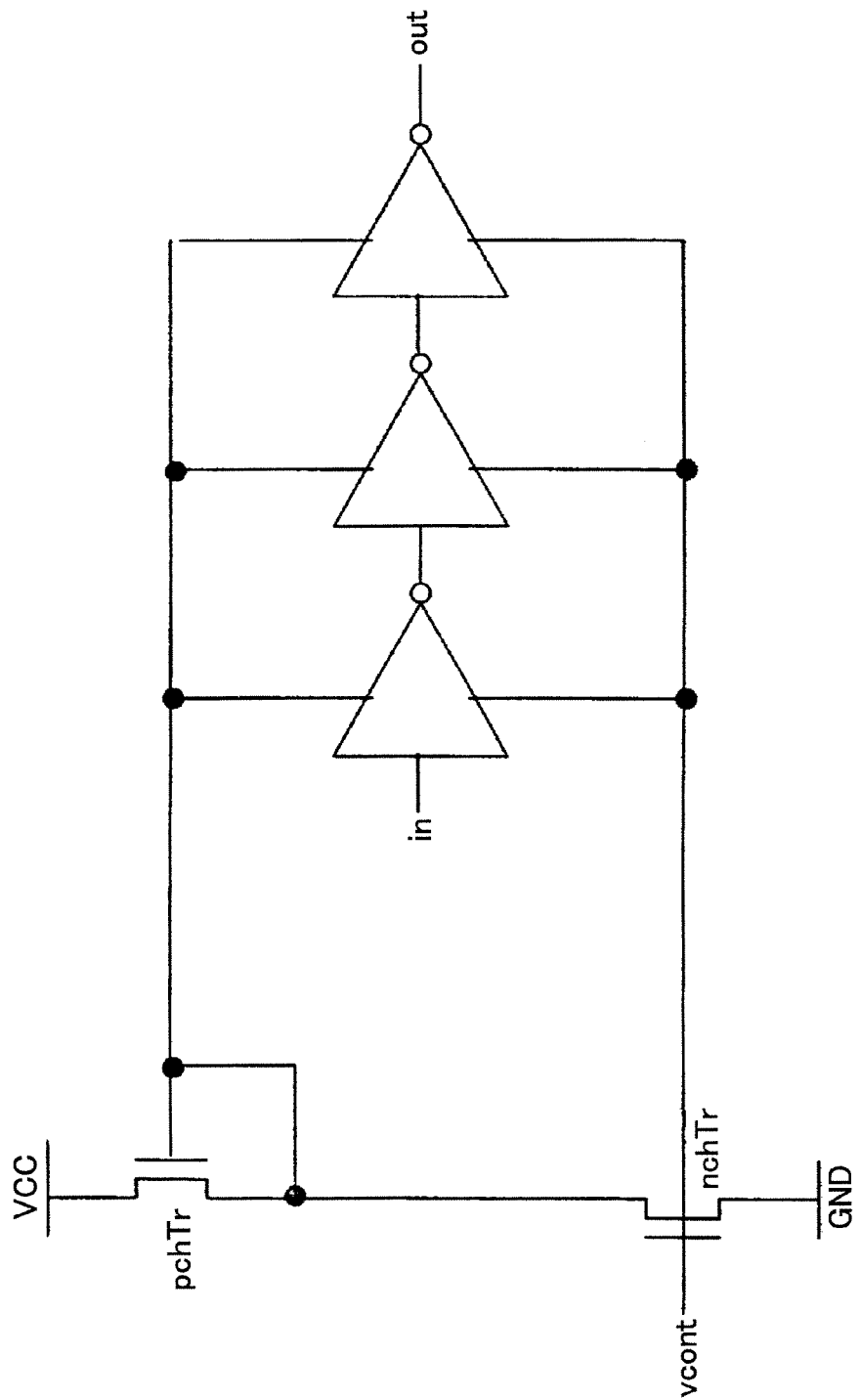
FIG. 26 is a schematic diagram showing an exemplary configuration of a delay buffer 2 corresponding to the delay buffer 1 shown in FIG. 24.

Next, an exemplary configuration of the delay buffer 102 provided in correspondence with the delay buffer 1 shown in FIG. 24 is described with reference to FIG. 26. The delay buffer 2 shown in FIG. 26 has the delay control inverter of FIG. 25 provided in a three step configuration. In this example, the delay control voltage vcont input to the delay buffer 2 is the delay control voltage vcont generated by the DLL shown in FIGS. 22 and 23 (i.e. the delay control voltage vcont so that the clock is delayed a ½ cycle in the delay buffer 1). Thereby, the delay time between the in and out of the delay buffer 2 becomes half of the delay time of the delay buffer 1. That is, the clock is delayed a ¼ cycle. Furthermore, by changing the number of steps of the delay control inverter, the delay time can be changed. Thus, in a case where the delay time of the delay buffer 2 is expressed as $\Delta d$, data delayed for $\Delta d$ with respect to a predetermined criterion can be generated since the data to be input to the gate of a switching transistor T51 (described below in FIG. 27) or the data to be input to the gate of a switching transistor T50 (described below in FIG. 28) are passed through the delay buffer 2.

This enables generation of data signals delayed for a length of $\Delta d$ being shorter than the fastest clock pulse width.

Figure 27:
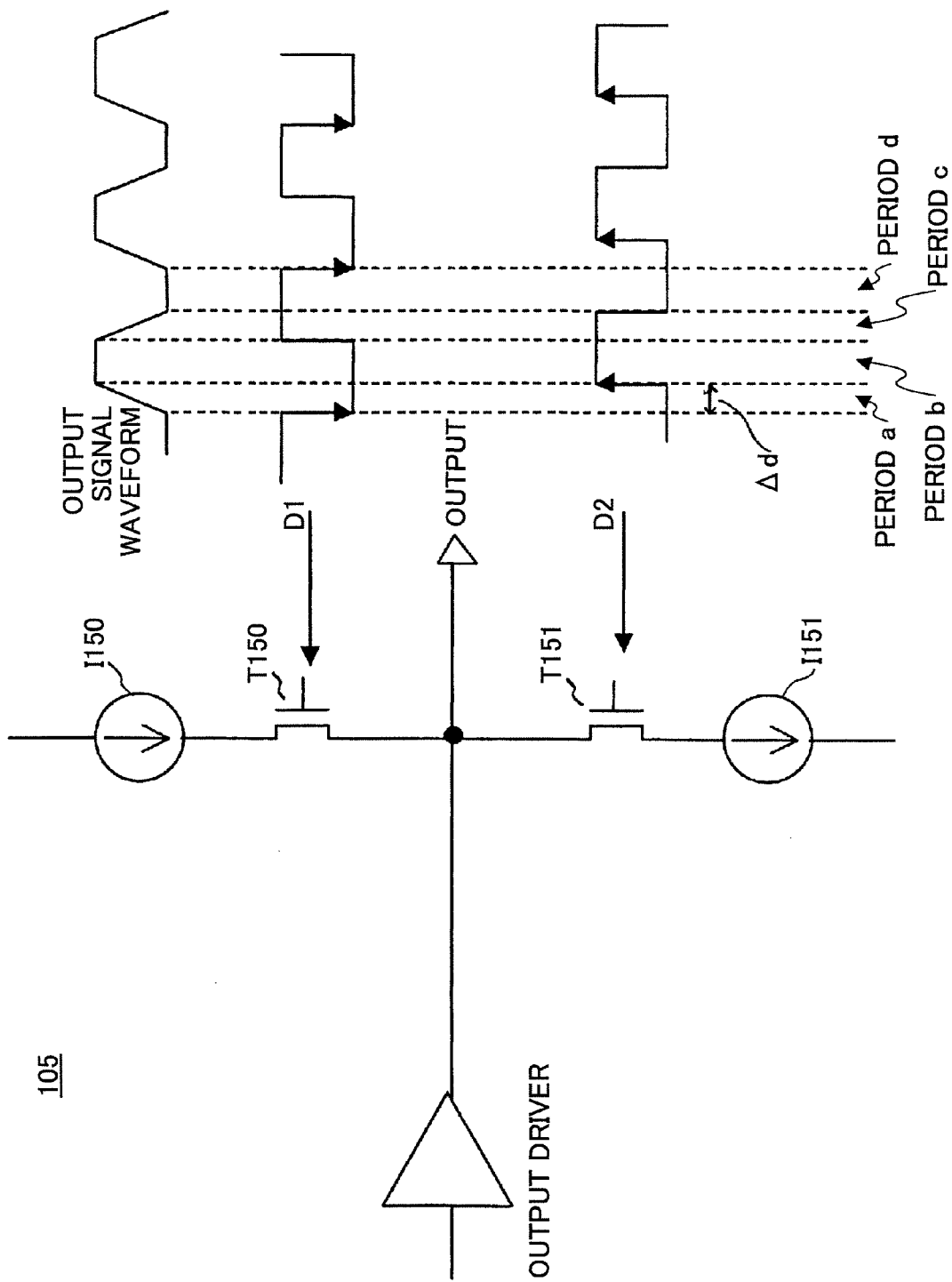
FIG. 27 is a schematic diagram showing a detail exemplary configuration of a current switching part 105 according to an embodiment of the present invention.
Figure 28:
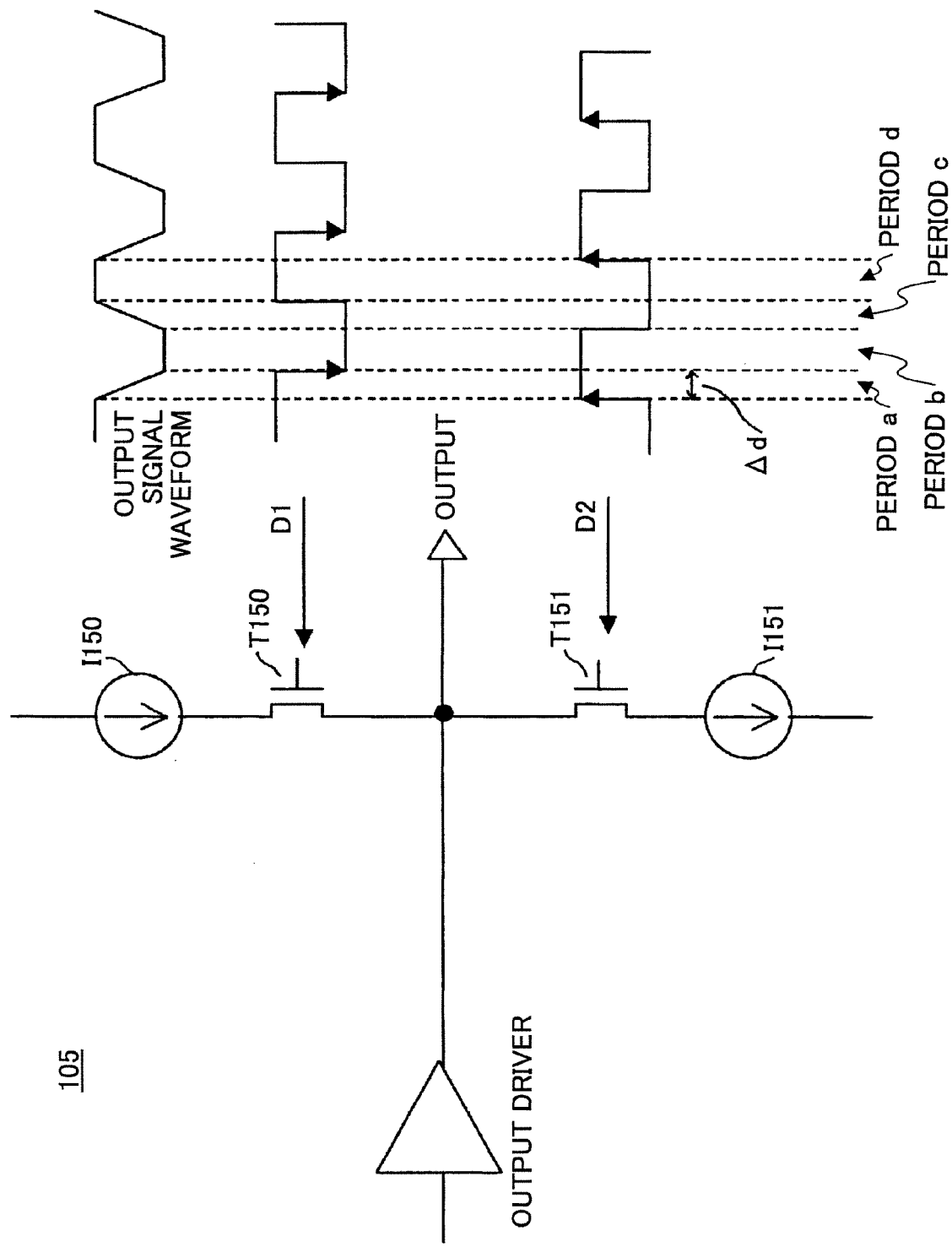
FIG. 28 is a schematic diagram showing another detail exemplary configuration of a current switching part 105 according to an embodiment of the present invention.

FIGS. 27 and 28 are schematic diagrams for describing the configuration of the electric current switching part 105. The electric current switching part 105 shown in FIG. 27 includes a P type current source I150 for subsidiarily supplying current to an output node, a switching-purpose pch transistor T150 (hereinafter referred to as "pch transistor T150") to which data D1 from the delay data generating part 108 shown in FIG. 22 are input, an N type current source I151 for subsidiarily absorbing current from an output node, and a switching-purpose nch transistor T151 (hereinafter referred to as "nch transistor T151") to which data D2 from the delay data generating part 108 (delay buffer 2) shown in FIG. 22 are input.

In FIG. 27, data D2 from the delay buffer 2 are input to the gate of the nch transistor T151. The input of the data D2 is delayed for $\Delta d$ with respect to the input of data D1 (inverse data). That is, the data D2 is input to the gate of the nch transistor T151 at a timing $\Delta d$ later than the input of the data D1 to the gate of the pch transistor T150. In this case, the pch transistor T150 performs switching in synchronization with the switching of the output driver. Here, the amount of current supplied from the P type current source I150 and the amount of current supplied from the N type current source I151 are set to be substantially equal. Accordingly, since the pch transistor T150 is switched on while the data D1 is low and the nch transistor T151 is switched off while the data D2 is low during period A shown in FIG. 27, the P type current source I150 supplies current to the output node during the period A (rise period of output signal). Furthermore, the pch transistor T150 is switched on while the data D1 is low and the nch transistor T151 is switched on while the data D2 is high during period B. In this case, since the amount of current supplied from the P type current source I150 and the amount of current supplied from the N type current source I151 are equal, the current shoots through from the power supply voltage to ground (GND) so that there is no charging or discharging of charge to the output node during the period B (high period of output signal). Furthermore, since the pch transistor T150 is switched off while the data D1 is high and the nch transistor T51 is switched off while the data D2 is high during period c, the N type current source I51 absorbs current from the output node (drop period of output signal). Furthermore, since the pch transistor T150 is switched off while the data D1 is high and the nch transistor T151 is switched off while the data D2 is low during period d, there is no charging or discharging of charge to the output node during the period D (low period of output signal). With the configuration shown in FIG. 27, there is no need to generate a short pulse of $\Delta$d. Furthermore, current (auxiliary current) can be subsidiarily supplied to the output node or absorbed from the output node only during the periods where the output signal (i.e. waveform of the output signal) changes.

The electric current switching part 105 shown in FIG. 28 also includes a P type current source I150 for subsidiarily supplying current to an output node, a pch transistor T150 to which data D2 from the delay data generating part 108 (delay buffer 2) shown in FIG. 22 are input, an N type current source I51 for subsidiarily absorbing current from an output node, and a nch transistor T151 to which data D1 from the delay data generating part 108 shown in FIG. 22 are input.

In FIG. 28, data D2 from the delay buffer 2 are input to the gate of the pch transistor T150. The input of the data D2 is delayed for $\Delta$d with respect to the input of data D1 (inverse data). That is, the data D2 is input to the gate of the nch transistor T51 at a timing being $\Delta$d later than the input of the data D1 to the gate of the pch transistor T150. In this case, the pch transistor T150 performs switching in synchronization with the switching of the output driver. Here, the amount of current supplied from the P type current source I150 and the amount of current supplied from the N type current source I151 are set to be substantially equal. Accordingly, since the nch transistor T151 is switched on while the data D1 is high and the pch transistor T150 is switched off while the data D2 is high during period A shown in FIG. 28, the N type current source I150 absorbs current from the output node during the period A (drop period of output signal). Furthermore, the pch transistor T150 is switched on while the data D2 is low and the nch transistor T151 is switched on while the data D1 is high during period B. In this case, since the amount of current supplied from the P type current source I150 and the amount of current supplied from the N type current source I151 are equal, the current shoots through from the power supply voltage to ground (GND) so that there is no charging or discharging of charge to the output node during the period B (low period of output signal). Furthermore, since the nch transistor T151 is switched off while the data D1 is low and the pch transistor T150 is switched on while the data D2 is low during period c, the P type current source I50 supplies current to the output node (rise period of output signal). Furthermore, since the pch transistor T150 is switched off while the data D1 is low and the nch transistor T151 is switched off while the data D2 is high during period d, there is no charging or discharging of charge to the output node during the period D (high period of output signal). With the configuration shown in FIG. 28, there is no need to generate a short pulse of $\Delta$d. Furthermore, current (auxiliary current) can be subsidiarily supplied to the output node or absorbed from the output node only during the periods where the output signal (i.e. waveform of the output signal) changes.

The difference between FIGS. 27 and 28 is the period (i.e. the period where the output signal is high or the period where the output signal is low) in which current (through-current) shoots through from the power supply voltage to GND. Furthermore, although the output data of the above-described operation and configuration of the present invention shown in FIGS. 23-26 is explained in a case where data switches between 1 and 0 every single pulse width (1U1), the above-described operation and configuration of the present invention can be applied to other data patterns by generating input patterns for corresponding switching-purpose transistors.

Figure 29:
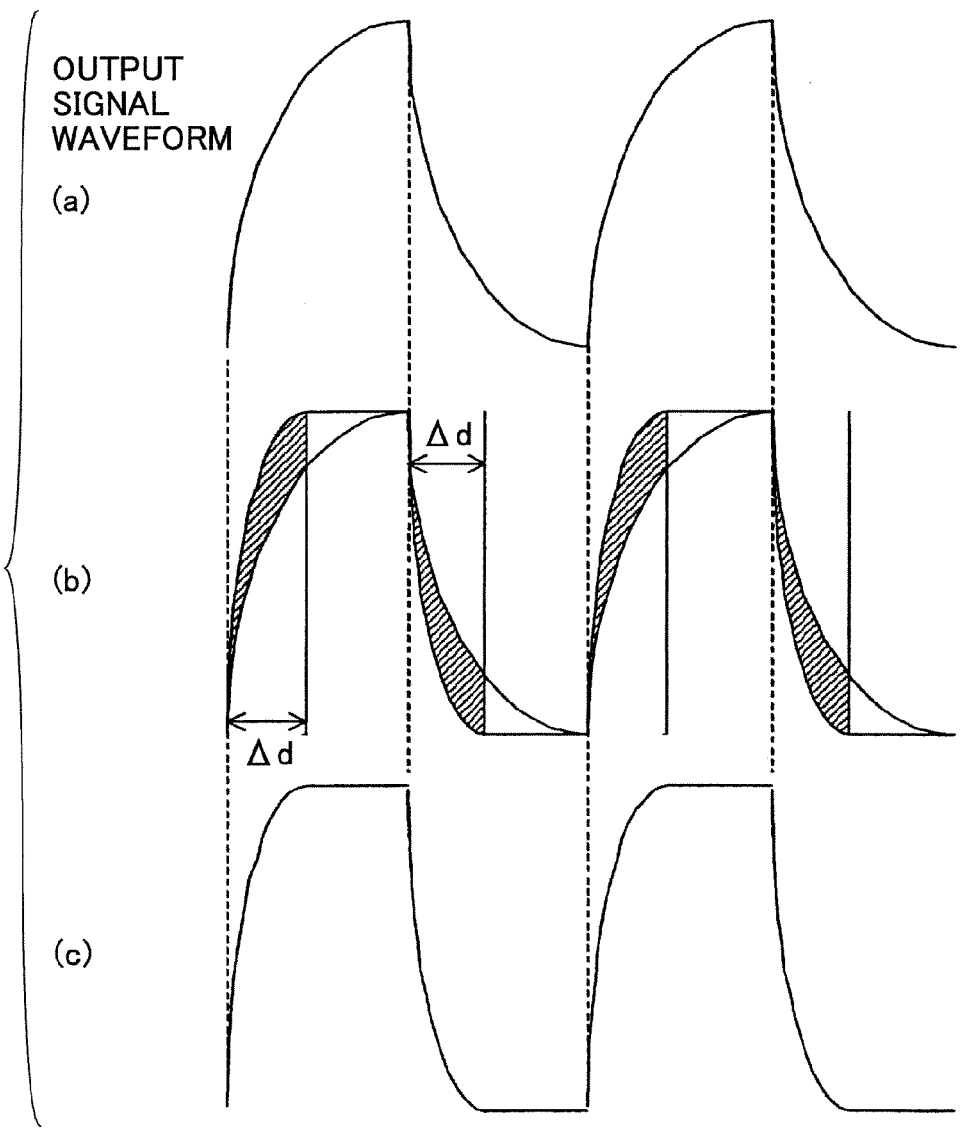
FIG. 29 is a schematic diagram for describing the behavior of the waveform of an output signal in a case where a current switching part 105 has the configuration shown in FIG. 27.

FIG. 29 is a schematic diagram for describing the behavior of the waveform of the output signal (how a waveform of an output signal is improved) in a case where the current switching part 105 has the configuration shown in FIG. 27. FIG. 29 (a) shows a waveform of an output signal in a case where no auxiliary switching part 105 is provided (i.e. a case where only an output driver is used). In the case shown in FIG. 29 (a), the waveform of the output signal has not completely reached a high or a low electric potential during a single data pulse width (1U1). Furthermore, in such a case, it becomes difficult for the receiver side to accurately detect data in a case where jitter is large. Therefore, in a case where an auxiliary current is supplied by the current sources I150, I151 for a period of $\Delta$d from the time of starting the switching operation (as shown in FIG. 29(b)), the waveform of the output signal has a shape similar to a square wave (as shown in FIG. 29(c)). The amount of charge of the supplied auxiliary current corresponds to the area shaded with diagonals lines between the period $\Delta$d in FIG. 29(b). It is however to be noted that there is a possibility that the amplitude of the output signal may increase in a case where the period $\Delta$d becomes substantially the same length as the width of a single data pulse (1U1). In such case where $\Delta$d becomes substantially equal to 1U1, the output signal becomes similar to a case of having the function of emphasis. Therefore, the period $\Delta$d needs to be shorter than the time required for the output signal to reach a desired voltage (amplitude).

Normally, in such system, the pulse width of the fastest clock cannot be made shorter than the period $\Delta$d. Even if the pulse width of the fastest clock could be made shorter than the period $\Delta$d, there is a possibility that the switch or the current source cannot respond sufficiently. That is, normally, a pulse based on a clock is used for switching a transistor on and off. Thus, it is difficult to control a transistor(s) with a resolution smaller than the fastest clock in the system. Furthermore, in a case where the output apparatus is a simple switching circuit, the switching speed is confined to a CR time constant (product of output impedance R and added capacity C) and cannot be increased any further than the CR time constant. Accordingly, the present invention is effective in solving such problems.

That is, the present invention serves to solve the problems by generating a delay of $\Delta$d by inputting a delay control voltage vcont from the DLL to the delay buffer 102 so that the input of the data D1, D2 to the switching-purpose transistors is delayed. By switching the switching-purpose transistors on and off with the data D1, D2, the speed of the rise or drop of the output signal can be increased.

With the present invention, the output driver, in a regular case, performs switching in accordance with data. However, in a case where a sufficiently fast rise or a sufficiently fast initial drop cannot be attained with respect to a single data pulse width (1U1) (for example, due to the influence of load capacity), the auxiliary switching part 104 subsidiarily supplies or absorbs current at the moment of switching. By doing so, the switching can be responsive to a case where the output signal is increased to high speed.

Figure 30:
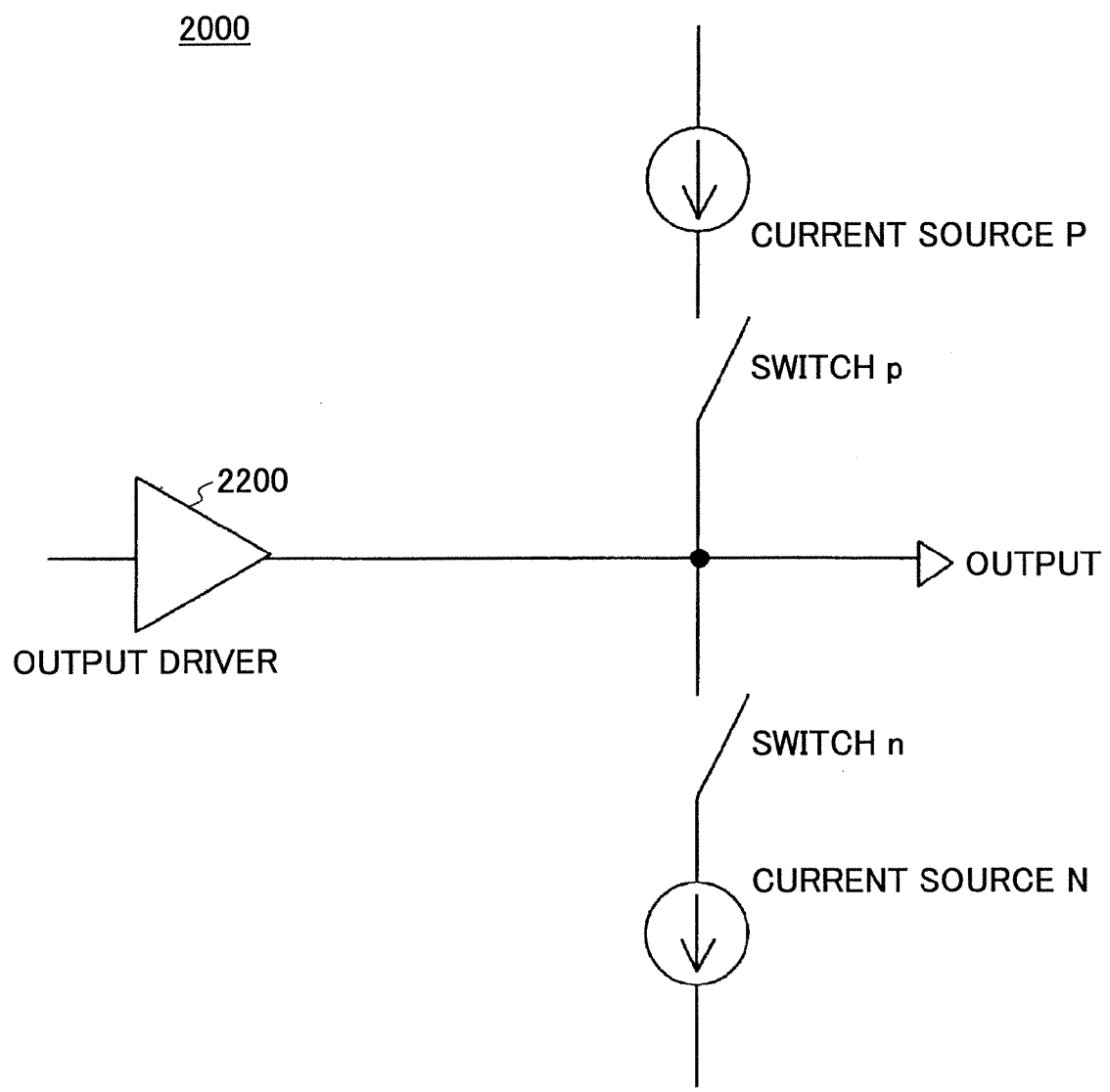
FIG. 30 is a conceptual diagram of an electric signal outputting apparatus according to an embodiment of the present invention.

FIG. 30 is a conceptual diagram of an electric signal outputting apparatus 2200 in a serial electric transmission system 2000 according to an embodiment of the present invention. The electric signal outputting apparatus 2200 includes an output driver, a current source P, a first switch p, a current source N, and a second switch n. In this example, the output driver has an impedance matching the transmission path. The current source P supplies current to the output node when the switch p is switched on. The current source N absorbs current from the output node when the switch n is switched on. Accordingly, high speed switching can be achieved by supplying and absorbing current at the moment when there is a change of data. Thus, output signals can be increased to high speed. Furthermore, by supplying and absorbing current with the current source, auxiliary current can be delivered without having to change output impedance (the output impedance of the current source is high impedance).

Figure 31:
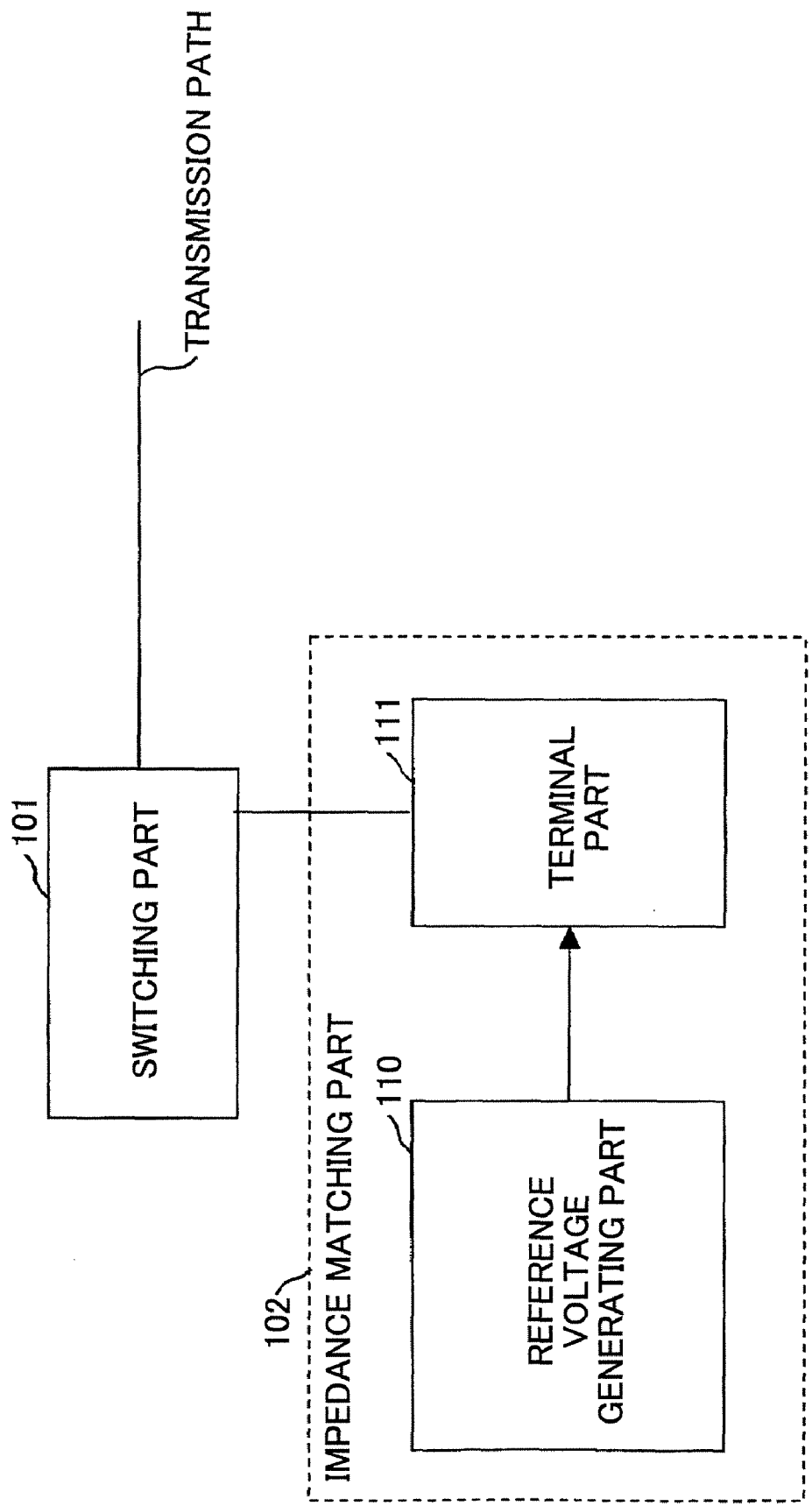
FIG. 31 is a schematic diagram showing an exemplary configuration of the impedance matching part 102 of FIG. 21.
Figure 32:
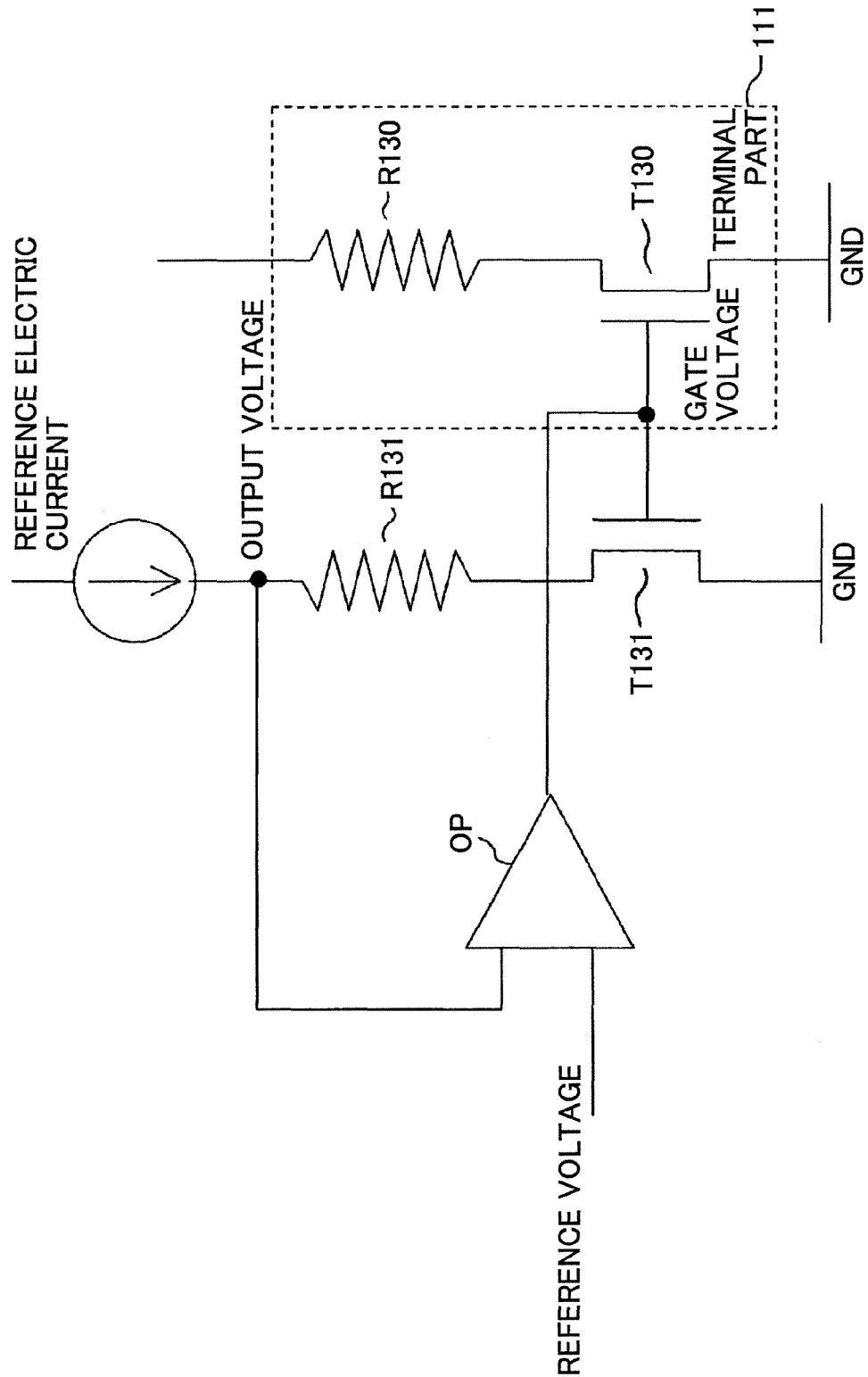
FIG. 32 is a schematic diagram showing a detail exemplary configuration of a terminal part 111 and a reference voltage generating part 110 according to an embodiment of the present invention.

FIG. 31 is a schematic diagram showing an exemplary configuration of the impedance matching part 102 shown in FIG. 21 according to an embodiment of the present invention. Although the impedance matching part 102 shown in the below-described FIGS. 31 and 32 is terminal with respect to GND, the same effect can be attained where the impedance matching part 102 is terminal with respect to the supply voltage Vcc.

As shown in FIG. 31, the impedance matching part 102 includes a reference voltage generating part 110 and a terminal part 111 which is controlled by the voltage generated by the reference voltage generating part 110.

More specifically, the terminal part 111 is configured to have a resistance value which is variable with respect to the voltage generated by the reference voltage generating part 110.

In the impedance matching part 102 shown in FIG. 31, the terminal part 111 includes a resistor and a transistor used for impedance matching (hereinafter referred to as "impedance matching transistor"). Furthermore, the reference voltage generating part 110 includes an operational amplifier (OP). The reference voltage generating part 110 uses the operational amplifier OP to generate a reference voltage and control the gate voltage of the impedance matching transistor. Thereby, a desired impedance can be attained.

FIG. 32 is a schematic diagram showing exemplary configurations of the terminal part 111 and the reference voltage generating part 110 according to an embodiment of the present invention. As shown in FIG. 32, the terminal part 111 has a resistor R130 and an impedance matching transistor (MOS transistor) T130 that are connected in series. In this example, the impedance matching transistor T130 is operated in a range of "Vds<Vgs−Vth" (linear area of transistor) in a case where "Vgs" is the gate voltage, "Vds" is the drain voltage between the drain and the source, and "Vth" is the threshold voltage. Accordingly, the transistor T130 can serve as a variable resistor. Thus, by using the reference voltage generating part 110 to control the gate voltage of the transistor T130, the composite resistance of the resistance R130 and the transistor T130 can be set to match the impedance of the transmission path.

As shown in FIG. 32, the reference voltage generating part 110 includes a dummy circuit part having the same configuration as the terminal part 111 (the part having a dummy resistor R131 and a dummy transistor (MOS transistor) T131 connected in series in FIG. 32) and an operational amplifier controlling the gate voltage of the dummy transistor T131 so that the output voltage matches the reference voltage when a reference current from a current source is supplied to the dummy circuit part.

The gate voltage of the dummy transistor T131 is added to the gate of the impedance matching transistor T130. For example, by matching the resistance value of the dummy resistor R131 and the size of the dummy transistor T131 with respect to the resistance value of the resistor R130 of the terminal part 111 and the size of the impedance matching transistor T130, the gate voltage of the impedance matching transistor T130 can be set to a predetermined value (that is, a value determined according to the reference current and the reference voltage). In other words, the reference voltage generating part 110 sets the reference current and the reference voltage so that the gate voltage of the impedance matching transistor T130 becomes a predetermined value.

Alternatively, the resistance value of the dummy resistor R131 and the size of the dummy transistor T131 may be different (not matched) with respect to the resistance value of the resistor R130 and the size of the impedance matching transistor T130 (described below).

Next, an operation of the above-described impedance matching part 102 according to an embodiment of the present invention is described. First, a reference current is supplied to the dummy circuit part of the reference voltage generating part 110. The operational amplifier OP in the reference voltage generating part 110 is controlled so that the output voltage at that time matches the reference voltage which is determined according to the impedance of the transmission path and the electric current value of the current source. That is, the output impedance of the electric signal outputting apparatus can be matched with the impedance of the transmission path in the case of controlling the operational amplifier OP for setting the reference current and the reference voltage so that the gate voltage of the impedance matching transistor T130 becomes a predetermined value. From the aspect of the actual circuit layout, the devices situated between the terminal part 110 and the dummy circuit part can be prevented from being inconsistently arranged by having the terminal part 111 and the dummy circuit part positioned close to each other and arranged symmetric to each other. Thereby, the actual output impedance or the input impedance can match the impedance of the transmission path.

In FIG. 32, the resistance value of the dummy resistor R131 and the size of the dummy transistor T131 may be made different (not matched) from the resistance value of the resistor R130 and the size of the impedance matching transistor T130 in the terminal part 111, so that the value of the composite resistance of the dummy circuit part is greater than the value of the composite resistance of the terminal part 111. Thereby, the current value (i.e. reference current) of the current source can be reduced. In this case, it is to be noted that the ratio between the resistance value of the dummy resistor R131 of the dummy circuit part and the resistance value (source-drain resistance value) of the dummy transistor T131 is to be equal to the ratio between the resistance value of the resistor R130 and the resistance value (source-drain resistance value) of the transistor T130 in the terminal part 131.

Figure 33:
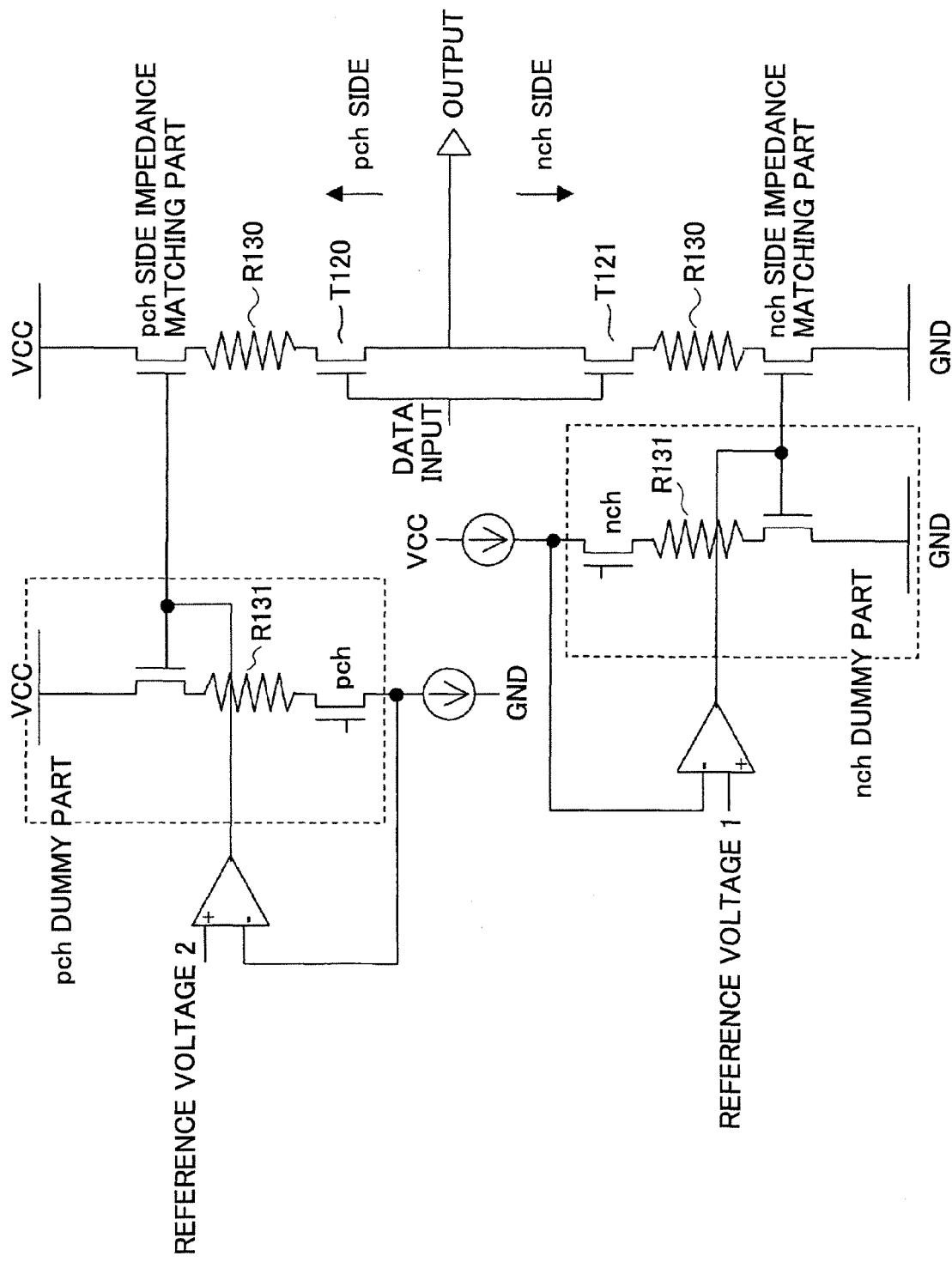
FIG. 33 is a schematic diagram showing a detail exemplary configuration of an output driver using an impedance matching part according to an embodiment of the present invention.

FIG. 33 is a schematic diagram showing an exemplary configuration of an electric signal outputting apparatus (e.g. output driver of an integrated circuit) using the above-described impedance matching part 102 according to an embodiment of the present invention. In this example, the switching part 101 is configured as an inverter. Furthermore, the impedance matching part 102 is provided to the pch side and the nch side of the switching part 101, respectively. That is, a switching-purpose pch transistor T120 (hereinafter referred to as "pch transistor T120") and a switching-purpose nch transistor T121 (hereinafter referred to as "nch transistor T121") are connected to the switching part 101. The pch transistor T120 is connected as an impedance matching part on the pch side of the switching part 101 and the nch transistor T121 is connected as an impedance matching part on the nch side of the switching part 101. Although the resistor R130 is provided in the terminal part 111 of the impedance matching part 102 in the embodiment shown in FIG. 32, the resistor R130 is connected in series with the pch transistor T120 or the nch transistor T121 so as to function as an inverter in a case where the switching part 101 has the configuration shown in FIG. 13. Therefore, technically, in this example shown in FIG. 13, the resistor R130 is part of the switching part 101 rather than being a part of the impedance matching part 102. That is, the function of the impedance matching part 102 is provided mainly by the transistor T130. By providing the impedance matching part 102 on the pch side and the nch side of the switching part 101 shown in FIG. 33, the impedance output from the electric signal outputting apparatus (output impedance) can be matched to the impedance of the transmission path.

Since the impedance matching part 102 according to this embodiment of the present invention has the configuration shown in FIG. 31 (i.e. the configuration including a reference voltage generating part 110 and a terminal part 111 controlled by the reference voltage generated by the reference voltage generating part 110, the terminal part including a resistor and an impedance matching purpose transistor, and the reference voltage generating part 110 including an operational amplifier for generating a reference voltage and controlling the gate voltage of the impedance matching purpose transistor so as to obtain a desired impedance), impedance matching can be achieved in real-time in correspondence with, for example, temperature change of the transistor without having to use a controller. In a conventional example where impedance is matched only during a calibration period (e.g. initial setting period), there may be a case where impedance cannot be matched due to, for example, a subsequent temperature change of the transistor. However, the present invention can prevent such problem since the present invention can match impedance not only in a predetermined calibration period (e.g. initial setting period) but rather in real-time.

Although the switching part 101 shown in FIG. 33 has a configuration of an inverter, the switching part 101 may alternatively have a configuration using a differential signal transmission method which generates and outputs two types of output signals (one being a normal output and the other being an inverted output).

Figure 34:
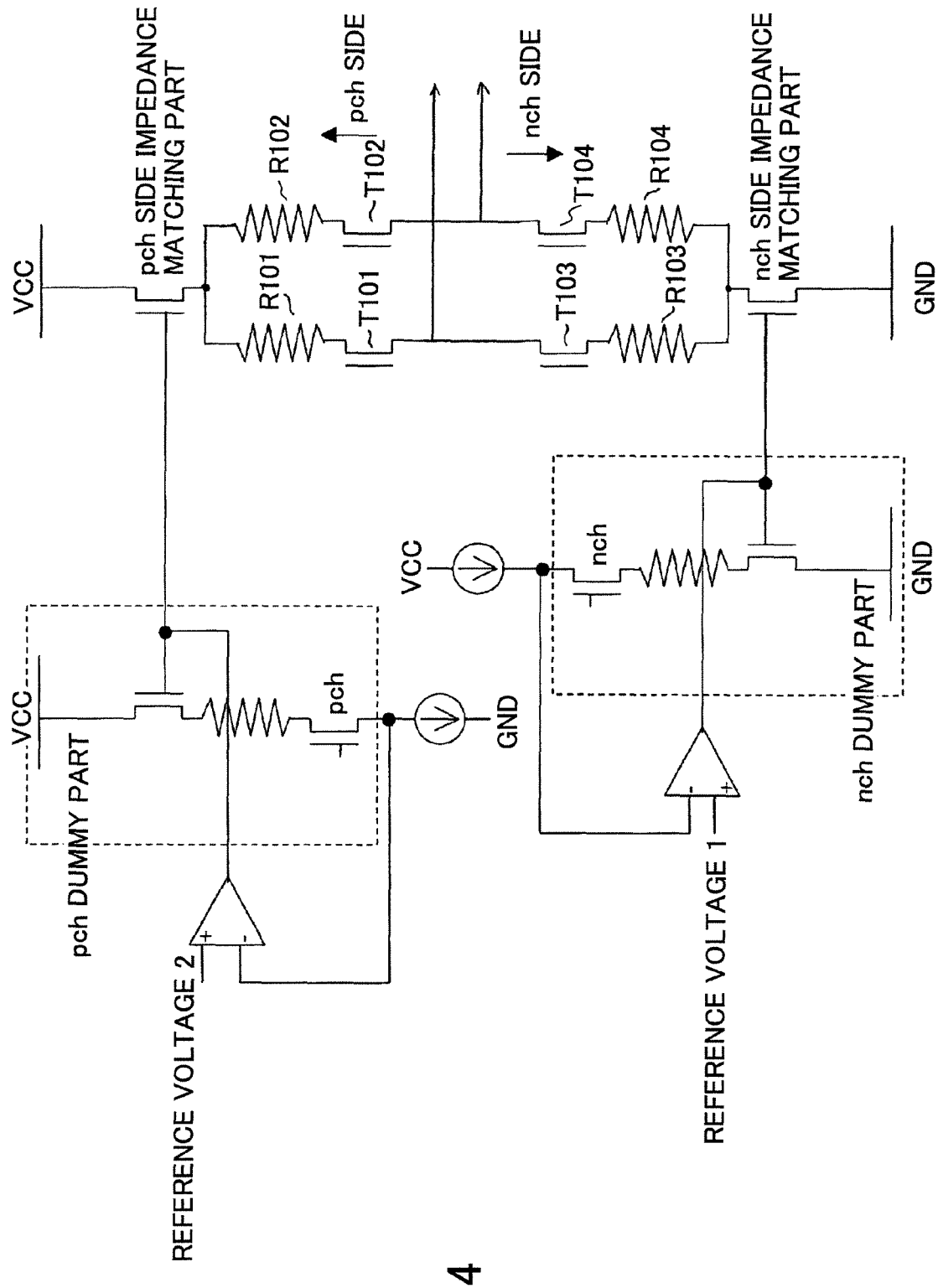
FIG. 34 is a schematic view showing a switching part 101 configured to use a differential signal transmission method generating and outputting two types of output signals (one being a normal output and the other being an inverted output)

FIG. 34 is a schematic view showing the switching part 101 configured to use the differential signal transmission method which generates and outputs two types of output signals (one being a normal output and the other being an inverted output).

As shown in FIG. 34, the switching part 101 includes: pch transistors (MOS transistors) T101, T102; resistors R101, R102 provided on the pch transistor side; nch transistors (MOS transistors) T103, T104; resistors R103, R104 provided on the nch transistor side; and output terminals Txp, Txm. With such configuration, the switching part 101 uses a differential signal transmission method for generating and outputting two types of output signals (one being a normal output and the other being an inverted output).

Figure 35:
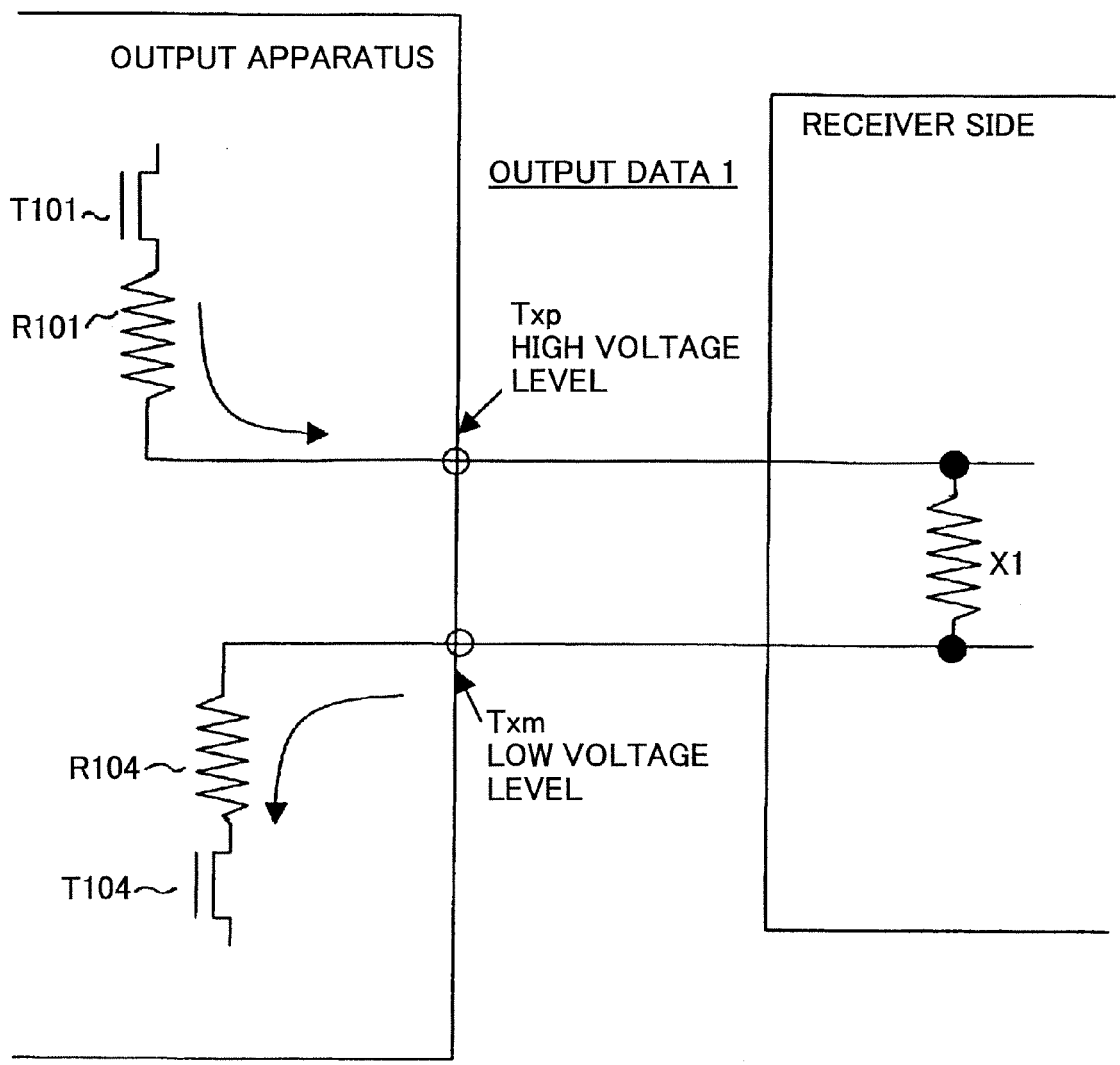
FIG. 35 is a schematic diagram for describing the switching part of FIG. 34.
Figure 36:
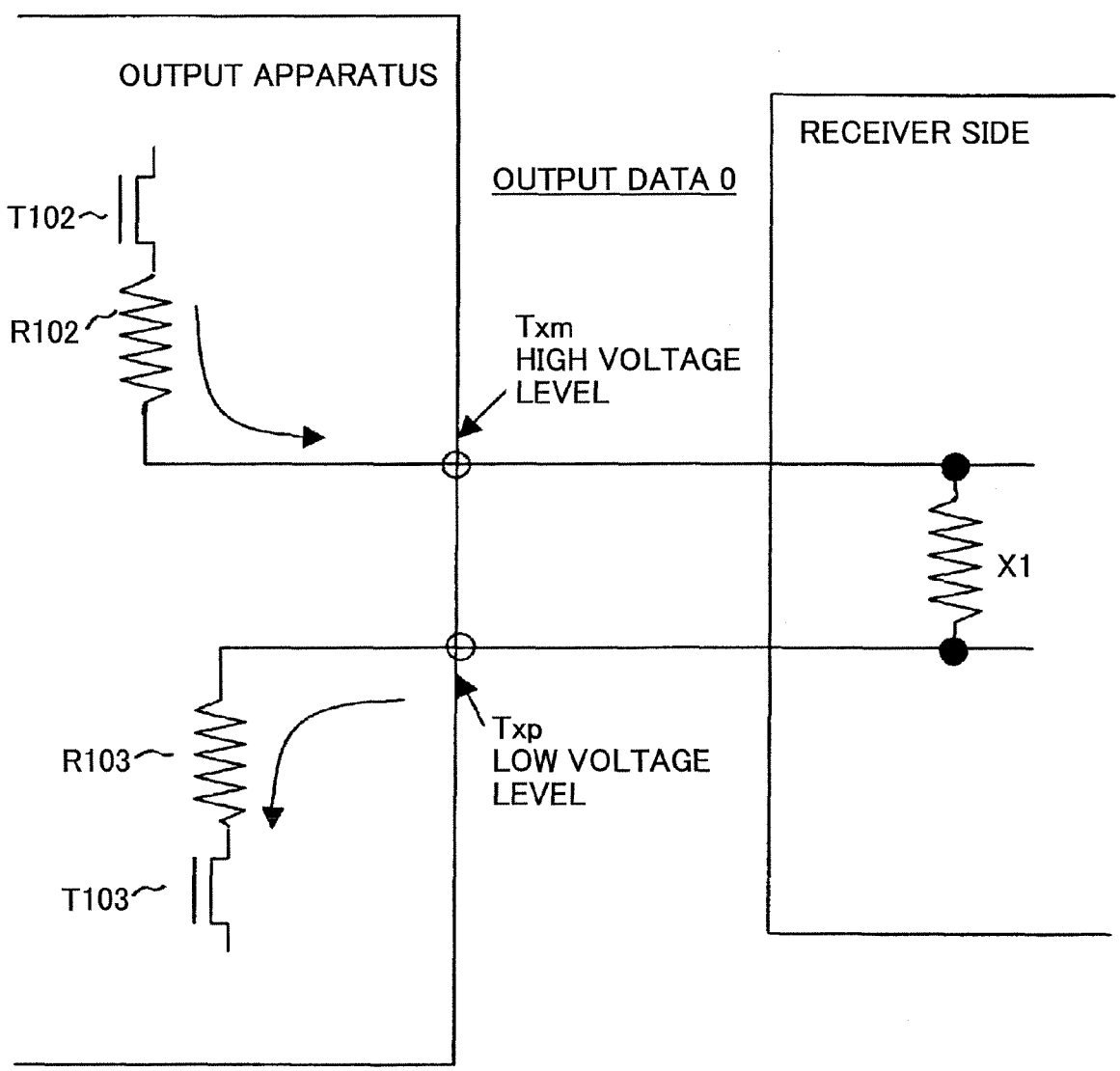
FIG. 36 is another schematic diagram for describing the switching part of FIG. 34.
Figure 37:
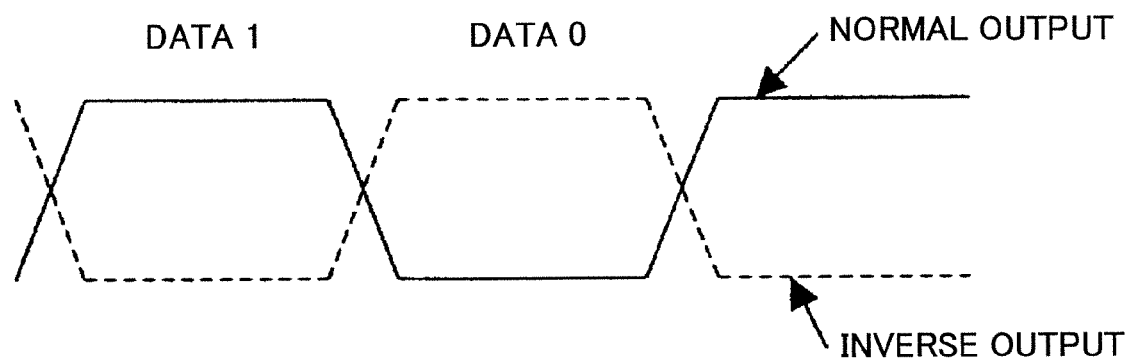
FIG. 37 is a yet another schematic diagram for describing the switching part of FIG. 34.

In the configuration shown in FIG. 34, the pch transistors T101, T102 and the nch transistors T103, T104 function as switch transistors. In a case where, for example, data 1 is input when only the pch transistor T101 and the nch transistor T104 are switched on, the pch transistor T101 and the nch transistor T104 form a circuit shown in FIG. 35, generate output signals corresponding to the normal output and the inverse output of the input data 1 shown in FIG. 37, and output the two output signals. In a case where, for example, data 0 is input when only the pch transistor T102 and the nch transistor T103 are switched on, the pch transistor T102 and the nch transistor T104 form a circuit shown in FIG. 36, generate output signals corresponding to the normal output and the inverse output of the input data 0 shown in FIG. 37, and output the two output signals.

Accordingly, since the switching part 101 shown in FIG. 34 is a differential signal transmission type that generates and outputs two output signals (one corresponding to normal output and the other corresponding to inverse output), the switching part 101 has greater durability with respect to noise of a common mode. Therefore, the configuration of the switching part 101 is effective against EMI.

Furthermore, the above-described electric signal outputting apparatus 2000 according to an embodiment of the present invention can be used in a semiconductor laser modulation driving apparatus having a semiconductor laser driving part and a semiconductor laser modulating part in a case where the semiconductor laser driving part and the semiconductor laser modulating part of the semiconductor laser modulation driving apparatus are each provided on separate chips (e.g. integrated circuits). More specifically, the above-described electric signal outputting apparatus according to an embodiment of the present invention can be used for electric signal transmission including serial electric signal transmission between the semiconductor laser driving part and the semiconductor laser modulating part.

Figure 38:
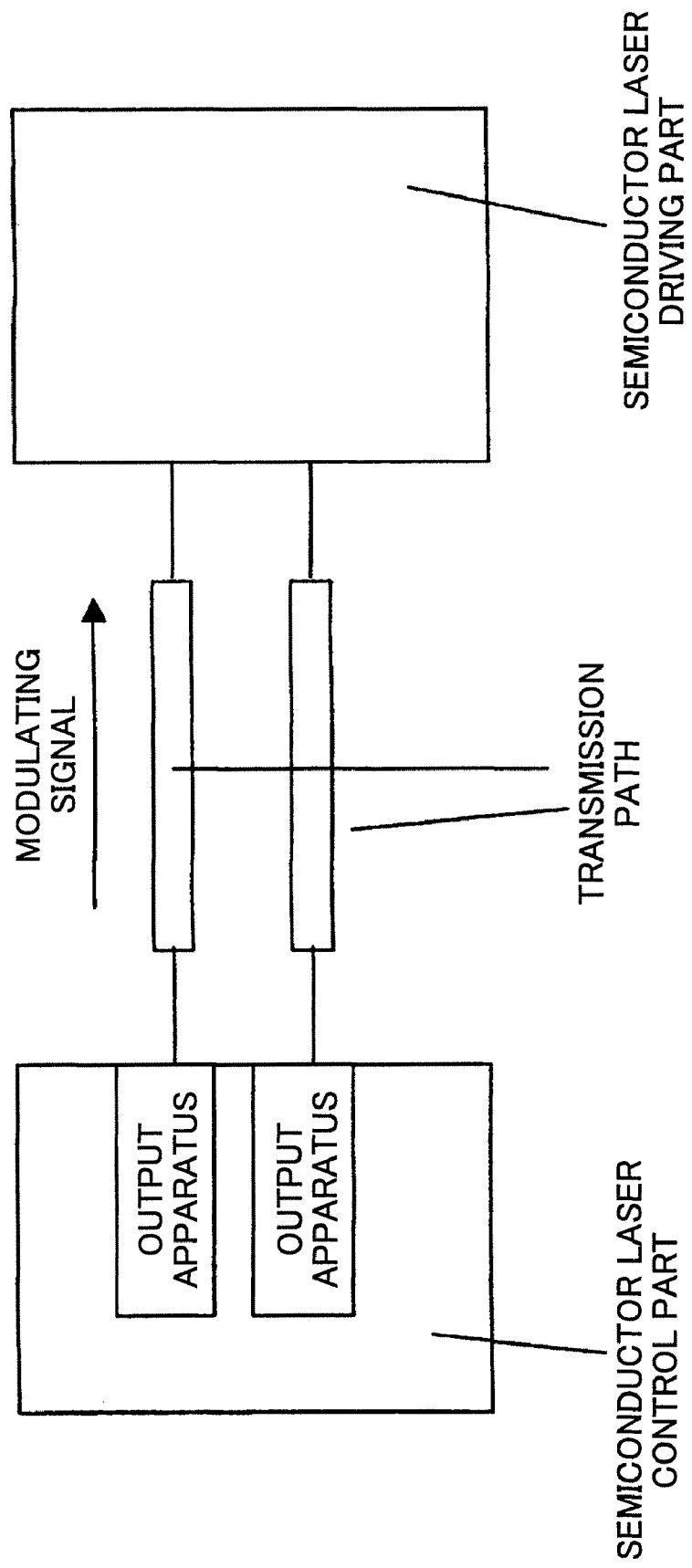
FIG. 38 is a schematic diagram showing an exemplary configuration of a semiconductor laser modulation driving apparatus employing the electric signal outputting apparatus according to an embodiment of the present invention.

FIG. 38 is a schematic diagram showing an exemplary configuration of a semiconductor laser modulation driving apparatus 2300 employing the electric signal outputting apparatus 2200 according to an embodiment of the present invention. In a case where a semiconductor laser driving part and a semiconductor laser modulating part (semiconductor laser control part) are provided into separate integrated circuits, signal transmission between the integrated circuits would be required. In such case, signals with little reflection can be accurately transmitted at high speed by using the electric signal outputting apparatus in an output part of the semiconductor laser control part.

Furthermore, the above-described electric signal outputting apparatus 2200 according to an embodiment of the present invention can be used in an image forming apparatus 2300 which conducts electric signal transmission between chips (e.g. integrated circuits) or between boards (e.g. printed circuit boards (PCB). That is, the above-described electric signal outputting apparatus 2200 or a semiconductor laser modulation driving apparatus 2300 including the electric signal outputting apparatus can be mounted in an image forming apparatus 2400 for conducting electric signal transmission between chips (e.g. integrated circuits) or between boards (e.g. printed circuit boards (PCB).

Figure 39:
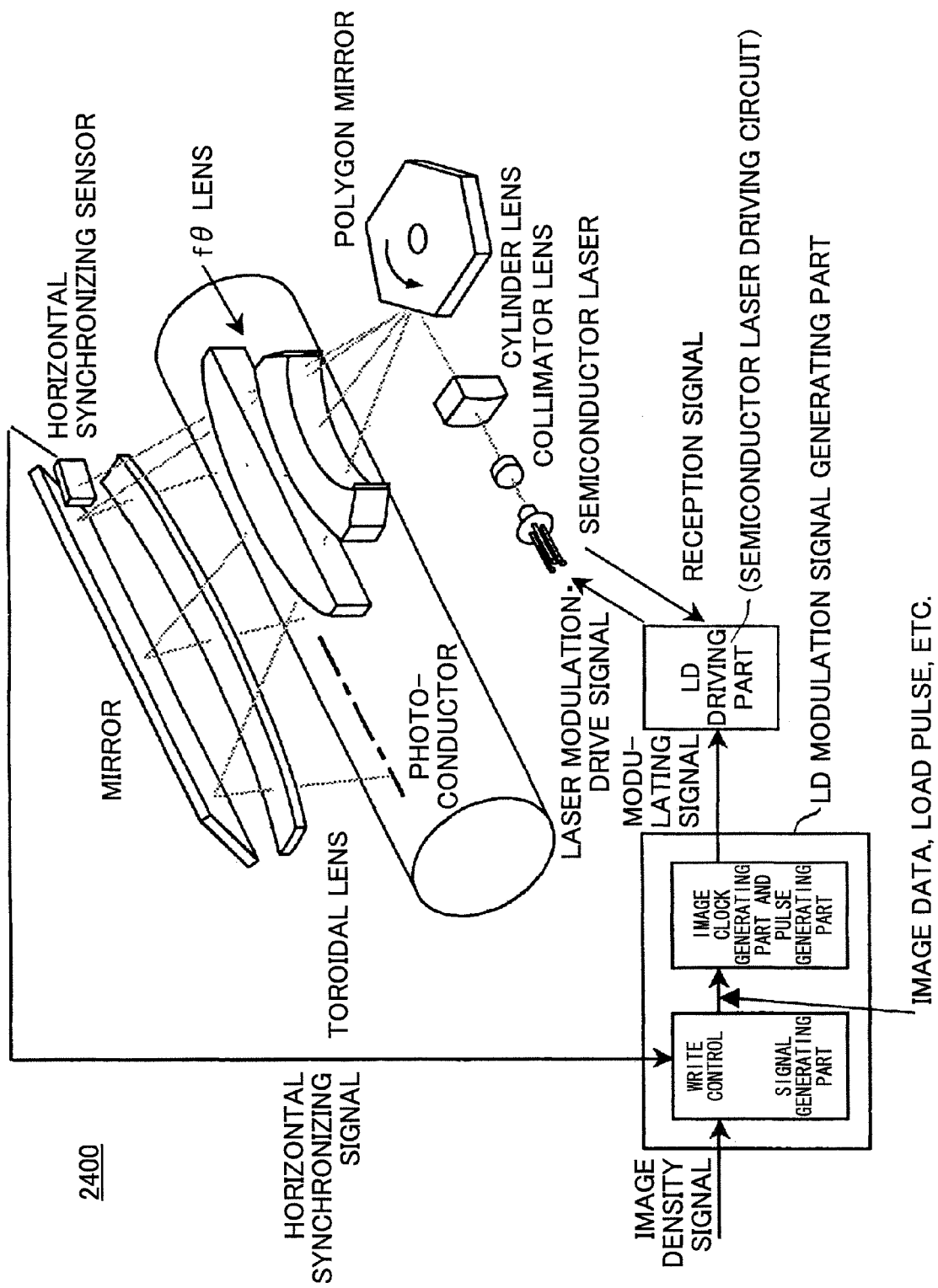
FIG. 39 is a schematic diagram showing an exemplary configuration of a raster scanning type image forming apparatus employing the electric signal outputting apparatus according to an embodiment of the present invention.

FIG. 39 is a schematic diagram showing an exemplary configuration of a raster scanning type image forming apparatus 2400 employing the electric signal outputting apparatus

2200 according to an embodiment of the present invention. In FIG. 39, the LD modulation signals generated in the LD modulation signal generating part are input to a semiconductor laser driving circuit for modulating the light of a semiconductor laser. The modulated laser light is input to a polygon mirror via a collimator lens and a cylinder lens, is deflected by the polygon mirror, and is incident on a photoconductor via an fθ lens. A horizontal synchronizing sensor detects the position for starting a writing operation and outputs horizontal synchronizing signals in accordance with the detected results. The horizontal synchronizing signals are input to an image processing part (not shown) and the LD modulation signal generating part. In accordance with the horizontal synchronizing signals from the horizontal synchronizing sensor and image signals (e.g. image density signals) from the image processing part, the LD modulation signal generating part outputs LD modulating signals therefrom. The write control signal generating part in the LD modulation signal part shown in FIG. 39 has a function of generating not only image data but also write control signals (e.g. counter signals in the main scanning direction and in the sub-scanning direction).

Accordingly, the electric signal outputting apparatus 2200 according to an embodiment of the present invention can be applied to the image forming apparatus 2400 shown in FIG. 39 for transmitting modulating signals from, for example, from the image clock generating part and the pulse generating part to the LD driving part. Thereby, modulating signals can be accurately transmitted at high speed with little reflection.

Figure 40:
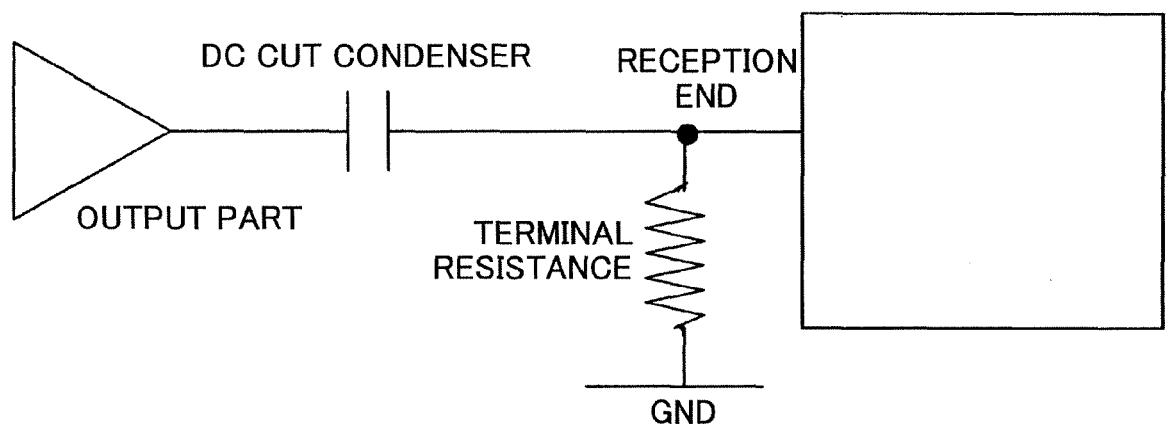
FIG. 40 is a schematic diagram showing a DC cut condenser provided in a transmission path according to an embodiment of the present invention.

Furthermore, as shown in FIG. 40, the transmission path according to an embodiment of the present invention may be provided with a DC cut condenser so that a DC cut is conducted between the sender side and the receiver side. However, the DC condenser is to have a sufficient capacity for enabling signal components to be transmitted therethrough. Furthermore, although the circuit diagram shown is terminal with respect to GND in FIG. 40, the same effect can be attained where the circuit is terminal with respect to the supply voltage.

Hence, the present invention can provide an electric signal outputting apparatus 2000 that can increase the initial rise or the initial drop of signals transmitted between integrated circuits or between printed circuit boards (PCB), to thereby accommodate increase to high speed. Furthermore, the present invention can provide a semiconductor laser modulation driving apparatus and an image forming apparatus that uses the aforementioned electric signal outputting apparatus.

EFFECT OF THE INVENTION

An embodiment of the present invention provides an electric signal outputting apparatus in a serial electric transmission system, the electric signal outputting apparatus including: a switching part for switchably generating high and low output signals in accordance with signal data and transmitting the output signals to a transmission path (output node); an impedance matching part for matching an output impedance to the impedance of the transmission path; and an auxiliary switching part for subsidiarily supplying current to an output node in the transmission path and subsidiarily absorbing current from the output node in the transmission path when the switching part switches the generation between high and low output signals; wherein the auxiliary switching part conducts the supplying and the absorbing for a period shorter than a pulse width of a reference clock of the serial electric transmission system. Accordingly, the electric signal outputting apparatus of the present invention can significantly increase the speed of the rise and the initial drop of output signals during electric signal transmission compared to a conventional example. Thereby, the electric signal outputting apparatus of the present invention can conduct signal transmission at high speed.

Particularly, in the electric signal outputting apparatus according to an embodiment of the present invention, the auxiliary switching data generating part may switch either one of the auxiliary switching pch transistor or the auxiliary switching nch transistor in synchronization with the switching part and switches the other one of the auxiliary switching pch transistor or the auxiliary switching nch transistor at a timing delayed a predetermined length shorter than the pulse width of the reference clock. Accordingly, the electric signal outputting apparatus of the present invention can significantly increase the speed of the rise and the initial drop of output signals during electric signal transmission compared to a conventional example without having to generate fine size pulse. Thereby, the electric signal outputting apparatus of the present invention can conduct signal transmission at high speed.

Furthermore, in the electric signal outputting apparatus according to an embodiment of the present invention, the impedance matching part includes a plurality of transistors, wherein the impedance matching part is configured to adjust the output impedance by selecting at least one of the plural transistors to be switched on. Accordingly, the electric signal outputting apparatus can have a simple configuration while being able to correct the output impedance of the electric signal outputting apparatus during electric signal transmission, accurately perform impedance matching, and conduct signal transmission at high speed. Furthermore, since the impedance matching part is formed of plural transistors, the impedance matching part can be formed in a small size. Thereby, size-reduction of circuits can be achieved.

Furthermore, in the electric signal outputting apparatus according to an embodiment of the present invention, the switching part may use a differential signal transmission method for generating a normal type output signal and an inverted type output signal and outputting the two types of output signals. Accordingly, the electric signal outputting apparatus of the present invention can attain greater durability with respect to noise of a common mode. Therefore, the switching part of the electric signal outputting apparatus of the present invention is effective against EMI.

Another embodiment of the present invention provides a semiconductor laser modulation driving apparatus including a semiconductor laser driving part and a semiconductor laser modulation part that are formed on separate chips, the semiconductor laser modulation driving apparatus including: the electric signal outputting apparatus for conducting signal transmission between the semiconductor laser driving part and the semiconductor laser modulating part. Accordingly, a semiconductor laser modulation driving apparatus capable of conducting high speed signal transmission can be provided without having to increase, for example, the scale of its circuits.

Another embodiment of the present invention provides an image forming apparatus conducting electric signal transmission between chips or boards, the image forming apparatus conducting the electric signal transmission by using the electric signal outputting apparatus or the semiconductor laser modulation driving apparatus according to an embodiment of the present invention. Accordingly, an image forming apparatus capable of conducting high speed signal transmission can be provided without having to increase, for example, the scale of its circuits.

An embodiment of the present invention provides an electric signal outputting apparatus in a serial electric transmission system, the electric signal outputting apparatus including: a switching part for switchably generating high and low output signals in accordance with signal data and transmitting the output signals to a transmission path; an impedance matching part for matching an output impedance to the impedance of the transmission path, the impedance matching part including a reference voltage generating part and a terminal part controlled in accordance with a voltage generated by the reference voltage generating part; and an auxiliary switching part for subsidiarily supplying current to an output node in the transmission path and subsidiarily absorbing current from the output node in the transmission path when the switching part switches the generation between high and low output signals, wherein the auxiliary switching part conducts the supplying and the absorbing for a period shorter than a pulse width of a reference clock of the serial electric transmission system. Accordingly, the electric signal outputting apparatus can have a simple configuration while being able to significantly increase the speed of the rise and the initial drop of output signals during electric signal transmission and conduct signal transmission at high speed.

Particularly, in the electric signal outputting apparatus according to an embodiment of the present invention, the terminal part may include a resistor and an impedance matching transistor, wherein the reference voltage generating part includes an operational amplifier, wherein the operational amplifier generates a reference voltage for controlling a gate voltage of the impedance matching transistor, to thereby obtain a desired impedance. Accordingly, the electric signal outputting apparatus can have a simple configuration while being able to control the output impedance of an outputting part during high speed signal transmission.

Furthermore, in the electric signal outputting apparatus according to an embodiment of the present invention, the reference voltage generating part may include a dummy circuit part having the same circuit configuration as the terminal part. Accordingly, the electric signal outputting apparatus can have a simple configuration while being able to control the output impedance of an outputting part during high speed signal transmission and operate at high speed without having to apply a large capacity load with respect to output.

Furthermore, in the electric signal outputting apparatus according to an embodiment of the present invention, the dummy circuit part may include a dummy resistor having a resistance value different from the resistance value of the resistor of the terminal part and a dummy impedance matching transistor having a size different from the size of the impedance matching t transistor. Accordingly, by increasing the value of the composite resistance of the dummy circuit part, the current consumption of the dummy circuit part can be reduced.

Further, the present invention is not limited to these embodiments, but variations and modifications may be made without departing from the scope of the present invention.

The present application is based on Japanese Priority Application Nos. 2005-347969 and 2005-350660 filed on Dec. 1, 2005 and Dec. 5, 2005, with the Japanese Patent Office, the entire contents of which are hereby incorporated by reference.

What is claimed is:

1. An electric signal outputting apparatus in a serial electric transmission system, the electric signal outputting apparatus comprising:

a switching part configured to switchably generate high and low output signals in accordance with signal data and transmitting the output signals to a transmission path;

an impedance matching part configured to match an output impedance to the impedance of the transmission path; and an auxiliary switching part configured to subsidiarily supply current to an output node in the transmission path and to subsidiarily absorb current from the output node in the transmission path when the switching part switches the generation between high and low output signals;

wherein the auxiliary switching part conducts the supplying and the absorbing for a period shorter than a pulse width of a reference clock of the serial electric transmission system based on a first data signal generated from the output signals and a second data signal generated from a delay buffer and having a time delay from the first data signal, and wherein the delay buffer includes a plurality of delay control inverters powered by a plurality of power supply sources, the plurality of delay control inverters being configured to reduce the time delay by increasing an electric current flowing in the plurality of power supply sources and to increase the time delay by reducing the electric current flowing in the plurality of power supply sources.

2. The electric signal outputting apparatus as claimed in claim 1, wherein the auxiliary switching part includes a current switching part that supplies current to the output node and absorbs current from the output node, and an auxiliary switching data generating part that generates auxiliary switching data used for supplying current to the output node and data used for absorbing current from the output node.

3. The electric signal outputting apparatus as claimed in claim 2, wherein the auxiliary switching data generating part includes a delay control voltage generating part that generates delay control voltage and a delay data generating part that generates delay data in accordance with the delay control voltage generated by the delay control voltage generating part.

4. The electric signal outputting apparatus as claimed in claim 3, the delay data generating part includes a delay locked loop.

5. The electric signal outputting apparatus as claimed in claim 2, wherein the current switching part includes a P-type current source that supplies current from a supply voltage to the output node, an N-type current source that absorbs current from the output node and outputs the absorbed current to GND, an auxiliary switching pch transistor provided between the P-type current source and the output node, and an auxiliary switching nch transistor provided between the N-type current source and the output node.

6. The electric signal outputting apparatus as claimed in claim 5, wherein the auxiliary switching data generating part switches either one of the auxiliary switching pch transistor or the auxiliary switching nch transistor in synchronization with the switching part and switches the other one of the auxiliary switching pch transistor or the auxiliary switching nch transistor at a timing delayed a predetermined length shorter than the pulse width of the reference clock.

7. The electric signal outputting apparatus as claimed in claim 1, wherein the switching part uses a differential signal transmission method for generating a normal type output signal and an inverted type output signal and outputting the two types of output signals.

8. A semiconductor laser modulation driving apparatus including
   a semiconductor laser driving part and a semiconductor laser modulation part that are formed on separate chips, the semiconductor laser modulation driving apparatus comprising:
   the electric signal outputting apparatus claimed in claim 1 for conducting signal transmission between the semiconductor laser driving part and the semiconductor laser modulating part.

9. An image forming apparatus comprising:
   the semiconductor laser modulation driving apparatus as claimed in claim 8.

* * * * *